United States Patent
Bicker et al.

(10) Patent No.: US 8,747,962 B2
(45) Date of Patent: Jun. 10, 2014

(54) METHOD AND DEVICE FOR THE INTERNAL PLASMA TREATMENT OF HOLLOW BODIES

(75) Inventors: Matthias Bicker, Mainz (DE); Robert Hormes, Muellheim (DE); Manfred Lohmeyer, Nackenheim (DE)

(73) Assignee: Schott AG (DE)

( * ) Notice: Subject to any disclaimer, the term of this patent is extended or adjusted under 35 U.S.C. 154(b) by 1553 days.

(21) Appl. No.: 12/063,761

(22) PCT Filed: Aug. 24, 2006

(86) PCT No.: PCT/EP2006/008302
§ 371 (c)(1),
(2), (4) Date: Sep. 8, 2010

(87) PCT Pub. No.: WO2007/022976
PCT Pub. Date: Mar. 1, 2007

(65) Prior Publication Data
US 2009/0155490 A1 Jun. 18, 2009

(30) Foreign Application Priority Data
Aug. 24, 2005 (DE) .......................... 10 2005 040 266

(51) Int. Cl.
H05H 1/24 (2006.01)
G10K 1/064 (2006.01)
C07C 1/00 (2006.01)
C07C 2/00 (2006.01)
C07C 4/00 (2006.01)

(52) U.S. Cl.
CPC . *H05H 1/24* (2013.01); *G10K 1/064* (2013.01)
USPC ........ 427/569; 427/579; 427/577; 118/723 R; 204/157.15

(58) Field of Classification Search
CPC ............ H05H 1/24; G10K 1/064; C07C 2/00; C07C 4/00
USPC ........................................................... 427/569
See application file for complete search history.

(56) References Cited

U.S. PATENT DOCUMENTS 5,702,770 A * 12/1997 Martin .......................... 427/475
5,736,207 A * 4/1998 Walther et al. ............... 428/34.7
(Continued)

FOREIGN PATENT DOCUMENTS

DE 31 16 026 A1 11/1982
DE 3528275 A1 2/1987
(Continued)

OTHER PUBLICATIONS

Medical Tube Technology Inc., Hypodermic Needle Gauge Sheet, Oct. 10, 2004, http://web.archive.org/web/20041010031333/http://www.medtube.com/hypo_chrt.htm.*

(Continued)

*Primary Examiner* — Dah-Wei D Yuan
*Assistant Examiner* — Kristen A Dagenais
(74) *Attorney, Agent, or Firm* — Kaplan Breyer Schwarz & Ottesen

(57) ABSTRACT

The invention relates to a method for the plasma treatment of workpieces, particularly workpieces in the form of hollow bodies, in which a treatment zone in a reactor chamber is at least partially evacuated, a process gas is introduced into the treatment zone, particularly into the cavity of the workpiece, and a plasma is ignited by means of injected electromagnetic energy in the process gas introduced into the treatment zone, wherein the process gas flows through the treatment zone between opposite ends of the zone during the plasma treatment.

25 Claims, 19 Drawing Sheets

(56) References Cited

U.S. PATENT DOCUMENTS

Figure 1:
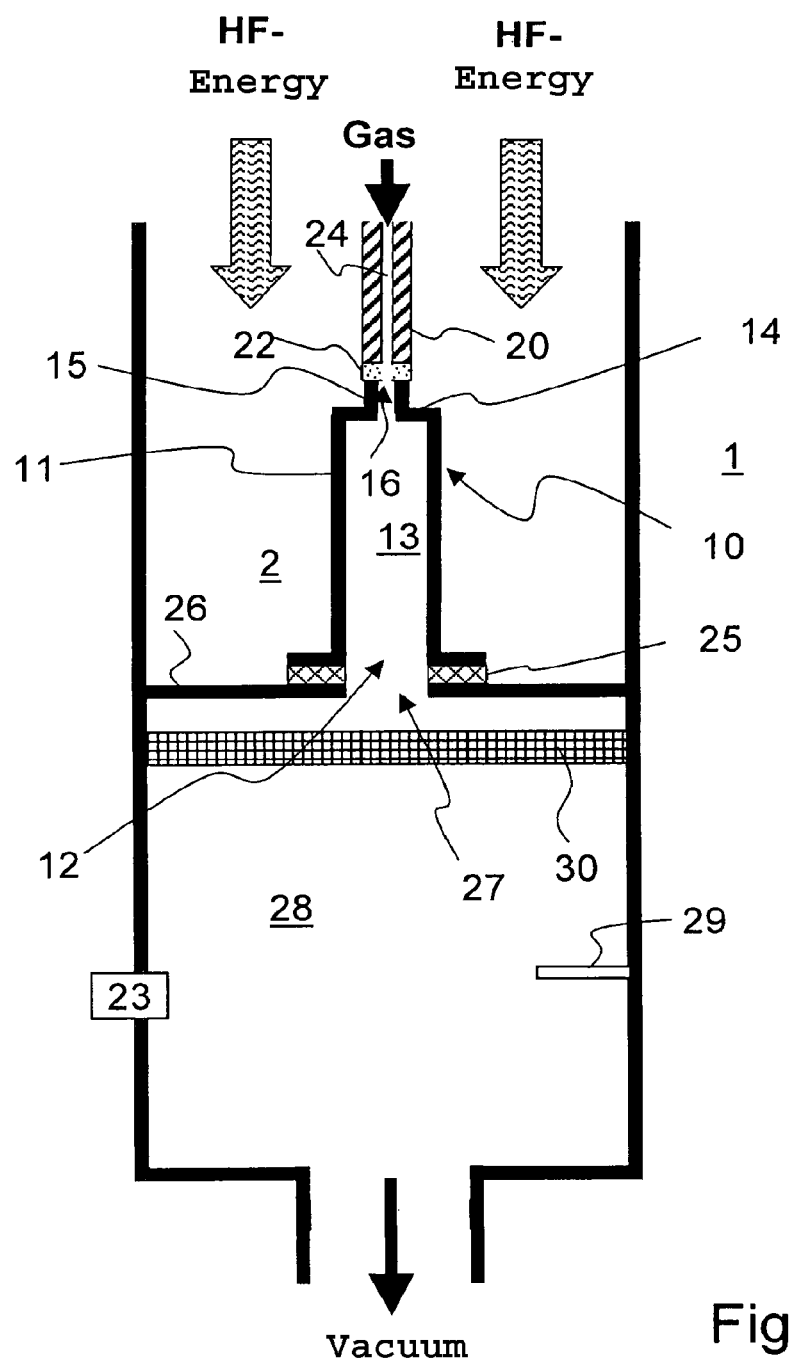

| | | | |
|---|---|---|---|
| 5,744,360 A * | 4/1998 | Hu et al. | 435/366 |
| 5,753,886 A * | 5/1998 | Iwamura et al. | 219/121.43 |
| 5,935,391 A | 8/1999 | Nakahigashi et al. | |
| 6,129,856 A * | 10/2000 | Jung et al. | 216/63 |
| 6,156,399 A * | 12/2000 | Spallek et al. | 428/34.6 |
| 6,649,223 B2 * | 11/2003 | Colpo et al. | 427/569 |
| 2002/0155218 A1 | 10/2002 | Meyer et al. | |
| 2003/0215652 A1* | 11/2003 | O'Connor | 428/451 |
| 2005/0233077 A1* | 10/2005 | Lizenberg et al. | 427/248.1 |
| 2005/0257744 A1* | 11/2005 | Boardman et al. | 118/723 MW |

FOREIGN PATENT DOCUMENTS

| | | | | |
|---|---|---|---|---|
| DE | 43 16 349 | A1 | 11/1994 | |
| DE | 102 53 512 | A1 | 6/2004 | |
| EP | 0 773 167 | A1 | 5/1997 | |
| EP | 0773167 | A1 * | 5/1997 | B65D 1/00 |
| EP | 0881197 | A2 | 4/1998 | |
| EP | 0992609 | A1 | 4/2000 | |
| EP | 1 251 190 | A1 | 10/2002 | |
| JP | 02228476 | A | 9/1990 | |
| JP | 05 255857 | A | 10/1993 | |
| JP | 07153597 | A | 6/1995 | |
| JP | 07300677 | A | 11/1995 | |
| JP | 2001310960 | A | 11/2001 | |
| JP | 62180077 | A | 8/2007 | |
| WO | 00/35256 | A | 6/2000 | |
| WO | 01/66818 | A1 | 9/2001 | |
| WO | 02/36850 | A2 | 5/2002 | |
| WO | 2004/031438 | A1 | 4/2004 | |

OTHER PUBLICATIONS

E.J. Hellund. The Plasma State. 1961. Reinhold Publishing Corporation. p. 1, 93-95.*

Robert W. Bassemir, Anthony J. Bean, James V. Crivello, Eugene D. Feit, Gerald W. Gruber, Vincent D. McGinniss, James E. Moore, S. Peter Pappas, Zeno W. Wicks, Jr. UV Curing: Science and Technology. 1978. Technology Marketing Corporation. pp. 103-113.*

Fr. Ostermeier, "DE Patent Application No. 10 2005 040 266.6-45", Sep. 24, 2008, Published in: DE.

Yoshiyuki Nishiyama, "JP Patent Application No. 2008-527392 Office Action", Aug. 16, 2012, Publisher: JIPO, Published in: JP.

Xiao Jia, "Chinese Patent Application No. 20068003498.2 Office Action", Sep. 18, 2009, Publisher: The Patent Office of the People's Republic of China, Published in: CN.

Yolaine Cussac, "Application No. PCT/EP2006/008302 International Preliminary Examination Report", May 29, 2008, Publisher: , Published in: DE.

"Related Japanese Patent Application No. JP 2008-527392 Office Action", Dec. 3, 2013, Publisher: JPO, Published in: JP.

* cited by examiner

METHOD AND DEVICE FOR THE INTERNAL PLASMA TREATMENT OF HOLLOW BODIES

The invention relates in general to the internal plasma treatment of substrates in the form of hollow bodies, particularly substrates with small diameters, such as typical pharmaceutical packaging.

EP 1 20 389 B1 discloses a method and a device for the sterile packaging of substances in plastic containers. A plasma treatment is carried out in this case, for example plasma sterilization, in which the plasma is excited selectively as a function of position and/or time in various zones of the walls of the container. The method and the device are intended to make it possible to carry out aseptic packaging, and even pyrogen-free packaging in the case of pharmaceutical products, of liquids in plastic containers such as ampoules, bottles or vials, and to combine this with further processing steps.

EP 1 251 190 A1 describes a method for the uniform coating of hollow bodies, wherein one open end of the hollow body is hermetically sealed by a lid, the hollow body is placed in a plasma-induced CVD reactor, a vacuum is applied to the hollow, body, a coating temperature is set up and the plasma-induced coating is carried out.

Furthermore, DE 196-29 877 C1 discloses a CVD method and a device for the internal coating of hollow bodies, in which the coating quality can already be predicted during production. A pulsed plasma method is used, in which the plasma is ignited by a chronological sequence of ignition pulses, and the time correlation of the light pulses of an oxygen plasma, as well as the intensity of at least one emission line of the coating gas, are measured and evaluated both during the heating phase and during the coating phase.

DE 196 34 795 C2 describes a plasma CVD system having an array of microwave plasma electrodes and a control circuit. Two neighboring plasma electrodes are respectively exposed by the control circuit to microwave pulses at different times, the duration of the pulse being short compared with the duration of a pulse conventionally used for pulsed plasma CVD methods.

DE 44 38 359 C2 discloses a plastic container with a barrier coating, the barrier coating consisting of a layer stack with sequentially arranged barrier layers of inorganic material consisting of one or more inorganic oxides, nitrides or oxynitrides or a mixture thereof, and an organic polymer material. The layer stack in this case contains at least two barrier layers made of the inorganic material. The layers are preferably deposited by means of plasma polymerization.

It is an object of the invention to improve the plasma treatment of small and/or elongate hollow bodies with narrow cross sections. The coating of such workpieces in the form of hollow bodies is a technical challenge which has to date been resolved only unsatisfactorily.

This object is directly achieved in an extremely surprisingly simple way by the subject-matter of the independent claims. Advantageous configurations and refinements of the invention are specified in the dependent claims.

Accordingly, the invention provides a method for the plasma treatment of workpieces, particularly workpieces in the form of hollow bodies, in which a treatment zone in a reactor chamber is at least partially evacuated, a process gas is introduced into the treatment zone, for instance the cavity of the workpiece, and a plasma is ignited by means of injected electromagnetic energy in the process gas introduced into the treatment zone, wherein the process gas flows through the treatment zone between opposite ends of the zone during the plasma treatment.

A corresponding device for the plasma treatment of workpieces, which is in particular adapted to carry out the method as defined above, comprises a reactor chamber, a treatment zone in the reactor chamber, an instrument for at least partially evacuating the treatment zone in the reactor chamber, an instrument for injecting electromagnetic energy into the treatment zone in order to generate a plasma in the process gas introduced in the treatment zone and an instrument for introducing process gas into the treatment zone, wherein the instrument for introducing process gas and the instrument for evacuating the treatment zone are arranged so that the process gas flows through the treatment zone between opposite ends of the zone during operation. The evacuation instrument is also used to discharge the process gas.

Workpieces which have dielectric properties at least in a local zone are preferably treated by the invention. The effect achieved by this is that the electromagnetic radiation cannot be shielded by conductive surfaces of the workpiece.

The plasma treatment may be carried out exclusively on the inside or exclusively on the outside of the workpiece of the hollow body. Two-sided plasma treatment, i.e. both on the inside and on the outside of the hollow body, may likewise be carried out. The plasma treatments may also advantageously be different on the inside and the outside of the hollow body, or affect the surfaces in different ways. This is possible, for example, by introducing different process gases into the surroundings and into the cavity.

The invention particularly advantageously allows the plasma treatment of small workpieces, which may furthermore be highly elongate. Thus, according to a refinement of the invention, workpieces may be treated which are shaped cylindrically or quasi-cylindrically and have a maximum external diameter of between 1 mm and 50 mm, preferably between 3 mm and 30 mm, preferably from 5 mm to 20 mm and a height of from 10 mm to 200 mm, preferably from 30 mm to 150 mm, particularly preferably from 50 mm to 100 mm. According to another refinement of the invention, cylindrically or quasi-cylindrically shaped workpieces with a maximum internal diameter of between 1 mm and 50 mm, preferably between 2 mm and 29 mm, particularly preferably from 4 mm to 20 mm and a height of from 10 mm to 200 mm, preferably from 30 mm to 150 mm, particularly preferably from 50 mm to 100 mm and a wall thickness of from 0.2 mm to 10 mm, preferably from 0.3 mm to 8 mm, particularly preferably from 2 mm to 5 mm are plasma-treated. In particular, such workpieces may be treated along their entire length or at least the entire length of the cavity of the workpieces.

The workpieces may comprise a second cylindrical or quasi-cylindrical, for example slightly conical appendage with a smaller diameter and a shorter length, which are preferably 20% less than the maximum diameter and the height. Such an appendage may for example be the connection element for the cannula, for example a Luer cone or a nozzle of a syringe body. This second cylindrical or quasi-cylindrical appendage with a smaller diameter and a shorter length may have a preferably narrow, cannula-like internal diameter of between 0.01 and 15 mm, particularly preferably between 0.05 and 4 mm. Workpieces with such geometries, which thus comprise different sections with very different diameters, may for the first time be treated satisfactorily by the through-flow principle according to the invention. Accordingly, the invention is in particular also suitable for small workpieces with a volume in the range of 0.1-100 ml, preferably in the range of 0.2-40 ml, particularly preferably 0.5-20 ml.

It has been found that by means of the through-flow principle according to the invention, coatings can be deposited very uniformly on all the surfaces, in particular internally. If barrier coatings are deposited, it is thereby possible to ensure that a barrier effect is achieved surface-wide. In the case of a cylindrical or quasi-cylindrical workpiece with a first cylindrical or quasi-cylindrical surface and a cylindrical or quasi-cylindrical appendage with a second cylindrical or quasi-cylindrical surface, at least one thin layer with a layer thickness D1 may thus be applied on the first cylindrical or quasi-cylindrical surface and the layer may be applied with a thickness D2 on the second quasi-cylindrical surface, the relation 0.2≤D2/D1≤5, preferably 0.4≤D2/D1≤1.5, particularly preferably 0.7≤D2/D1≤1.2 being satisfied for the ratio of the thicknesses D1 and D2. For syringes in which the cylindrical or quasi-cylindrical appendage represents the nozzle or the luer cone, a coating with a sufficient barrier effect can thereby also be deposited inside the nozzle.

It is likewise possible to deposit a scratch protection layer by means of the through-flow reactor according to the invention. This may be deposited internally and/or in particular externally.

Another embodiment of the invention provides a method for the plasma treatment of workpieces in the form of hollow bodies, in which the cavity of the workpiece is at least partially evacuated, a process gas is introduced into the cavity of the workpiece, and a plasma is ignited by means of injected electromagnetic energy in the process gas introduced into the cavity, the workpiece in the form of a hollow body furthermore comprising at least one opening leading into the cavity at a first end of the workpiece and the cavity being evacuated through this opening, wherein the process gas is put into the cavity at a position which lies at least half the longitudinal extent of the cavity away from the opening at the first end of the workpiece.

To this end a device according to the invention for the plasma treatment of workpieces in the form of hollow bodies, which is suitable in particular for carrying out the method, comprises a holder in a reactor chamber for at least one workpiece in the form of a hollow body with a connection instrument to connect an evacuation instrument, for at least partially evacuating the cavity of the workpiece, to an opening leading into the cavity at a first end of the workpiece, an instrument for injecting electromagnetic energy into the cavity in order to ignite a plasma in process gas which can be introduced in the cavity, and an instrument for introducing process gas at a position in the cavity which lies at least ⅔ of the longitudinal extent of the cavity away from the opening at the first end of the workpiece.

The process gas is therefore respectively put in essentially opposite to the opening of the cavity which is used for the evacuation. The process gas thus flows through at least the majority of the cavity in a directed movement. This configuration has proven particularly advantageous for achieving a uniform plasma treatment on the inner surface of the workpiece.

It is even more advantageous for the process gas to be put into the cavity by means of a suitably designed instrument at a position which lies at least ⅔, more desirably ¾, preferably 9/10, particularly preferably 95/100 of the longitudinal extent of the cavity away from the opening at the first end of the workpiece.

To this end the process gas may be put into the cavity through a cannula, the opening of which lies at least ⅔, more desirably at least ¾, preferably 9/10, particularly preferably 95/100 of the longitudinal extent of the cavity away from the opening at the first end of the workpiece. Dielectric material, in particular ceramic, is preferably used for the cannula.

In order to be able to plasma-treat the surface of elongate and/or small workpieces with narrow cross sections uniformly, the invention also provides a method and a device in which a treatment zone in a reactor chamber is at least partially evacuated by means of an evacuation instrument, a process gas is introduced into the treatment zone, particularly into the cavity of the workpiece, and a plasma is ignited by means of injected electromagnetic energy in the process gas introduced into the treatment zone, wherein the process gas is put into the treatment zone through at least one cannula, the internal opening diameter of which is between 0.1 and 5.0 mm, preferably between 0.2 mm and 3.0 mm, particularly preferably between 0.3 mm and 2.0 mm and the wall thickness of which is between 0.05 mm and 3.0 mm, preferably between 0.1 mm and 2.0 mm, particularly preferably between 0.15 mm and 1.0 mm.

According to another particularly preferred embodiment of the invention, the workpiece is evacuated through an opening at a first end and the process gas is introduced through another opening at a second end of the workpiece, which lies opposite the first end. The openings may also have different cross sections in this case. This achieves flow of the process gas through in a direction between the two openings. In order to achieve particularly homogeneous deposition, according to a refinement, the electromagnetic energy may additionally be input in the axial direction, particularly preferably axisymmetrically to the workpiece.

By means of the invention, a continuous directed gas flow is achieved which flows through the zone of the reactor in which the plasma is ignited, in particular through the cavity to be treated. In contrast to this, dead zones in which there is scarcely any flow may be formed in previously known coating devices when filling with the process gas. This becomes commensurately more critical as the cross sections to be coated are narrower. Exchange of the process gas is thereby at least retarded in these zones, which inter alia may have a detrimental effect on the coatings being applied.

Irrespective of whether the process gas is fed in through a cannula or through a second opening of the workpiece, in a preferred refinement of the invention an axisymmetric flow of the process gas through the cavity of the workpiece is established in order to achieve uniform coating. In general it is favorable, especially for the preferred small dimensions of the workpieces, for the electromagnetic energy to be input into the cavity or the surroundings of the workpiece in the axial direction of the workpiece, particularly preferably axisymmetrically. This allows a maximally homogeneous field distribution in the region of the workpiece surface to be coated, and therefore more homogeneous coating. In the case of syringe bodies, the input is therefore preferably carried out axisymmetrically with its cylinder axis.

The plasma treatment may in particular comprise plasma coating, and furthermore plasma activation, plasma pretreatment, plasma cleaning, plasma immersion or plasma modification. Furthermore, a plurality i.e. at least two of these treatment steps may advantageously be carried out by means of the method according to the invention, or the corresponding device.

A layer which contains at least one of the substances $SiO_x$, $SiO_xC_y$, $SiO_xN_y$, $SiN_y$, $TiO_x$, $Al_xO_yN_z$, $Al_xN_z$, $Al_xO_y$, $C_xH_y$, $C_xF_y$, $TiN_x$ may be deposited by the plasma treatment. The layer thicknesses are preferably greater than 5 nanometers, in particular greater than 20 nanometers, particularly preferably greater than 50 nanometers.

The method according to the invention, or the corresponding device according to the invention, may furthermore be integrated into a production and/or treatment line. Thus, the plasma treatment can already achieve advantageous properties on the workpiece within the process line, which are directly manifested within the subsequent process line for example by obviating further treatment steps or by a better achievable yield, for example a sterile or scratch-resistant surface. The invention is suitable in particular for the various types of pharmaceutical packaging. For instance, the cavity of the workpiece may also particularly advantageously be sterilized during the plasma treatment. The plasma treatment may also serve the sole purpose of sterilization in this case. If the cavities of the workpieces are sterilized, then in an advantageous refinement of the invention the plasma treatment may also be followed by further processing steps in a sterile environment. These may extend up to the form of the workpieces ready for dispatch or sale, for example filling the workpieces with medicaments and/or sterilely packaging them.

For such integration of the method according to the invention into a production line to produce packaged pharmaceutical products, a production or treatment line may for example contain the following steps: production of the workpiece (for example injection molding, blow molding, hot molding, for example in the hot molding of raw glass), cleaning the workpiece, plasma treatment, siliconizing, filling, sterilizing, packaging. In another advantageous embodiment of the invention, additional sterilization may also be obviated if the sterilization achieved by the plasma treatment is already sufficient and the subsequent steps take place in a sterile environment.

The plasma treatment according to the invention offers an advantage even before use of the product (i.e. for example before use of a prefilled syringe or opening the packaging), particularly preferably already within the industrial manufacturing line, since inter alia at least one of the properties: storage stability of the product with which the packaging is filled, sterility or scratch resistance, can be improved.

In particular for the plasma treatment of pharmaceutical containers as well, it has proven advantageous to generate a pulsed plasma for the plasma treatment. To this end, the instrument for injecting electromagnetic energy into the cavity comprises an instrument for generating pulsed electromagnetic energy. Using a pulsed plasma, process waste gases can be discharged in the pulse pauses. In this way, for example during plasma coating, it is possible to prevent sizeable particles of the coating material from being formed in the plasma and being able to deposit on the surface of the cavity of the workpiece. Substantially higher peak powers can furthermore be used compared with a continuous plasma, which in turn accelerates or substantially improves the sterilization.

Particularly for small pharmaceutical packaging with narrow cross sections, it has surprisingly been found that uniform coating is not necessarily achieved only when the electromagnetic energy can penetrate through the cavity with minimal impediment. Rather, it has been found that at least local shielding may be provided, which encloses the workpiece and locally shields zones of the cavity of the workpiece against injected electromagnetic energy. The shielding can prevent a particularly hot plasma from being formed locally in the cavity, which may detrimentally affect the coating and in particular the workpiece.

In order to improve the product properties of pharmaceutical packaging in particular, at least one barrier layer is particularly preferably deposited by the plasma treatment. Such a barrier layer may be a barrier against ingress or egress of gases such as oxygen, hydrogen or $CO_2$. It is furthermore possible to deposit at least one barrier layer which has a barrier effect against constituents from the workpiece, for example initial or byproduct or final compounds from the production of the workpiece. For instance, a suitable barrier layer may prevent or at least retard the migration of substances from the substrate. The ion leaching of glasses or the dissolving of substances from polymers, for example from plastic containers, may also be avoided or retarded. At least one barrier layer with a chemical barrier effect may furthermore be deposited.

A preferred embodiment of the invention relates to a device and a method for the internal plasma treatment of syringe bodies. Owing to their generally elongate cylindrical shape and the attached Luer cone or nozzle, onto which the cannula is fitted, these are difficult to coat. By means of the invention, in which the process gas essentially flows in an axial direction through the syringe body, it is however possible to achieve good, uniform results in the plasma treatment.

Owing to the very narrow cross sections of syringes, especially in the region of the Luer cone or the nozzle, (internal) coating of syringes is a technical challenge which has not been resolved by the prior art to date. Ignition of a plasma in the narrow cross section, and uniform coating, have not yet been achieved by conventional coating technology owing to the narrow cross sections. Particularly in embodiments of syringes with asymmetric cross sections, for example with a geometry in which the mid-axes of the nozzle and the cylinder body are mutually offset laterally, the technical challenge is particularly great.

It is in this case particularly expedient for the cavity of the syringe to be evacuated through its plunger opening. To this end, a device according to this embodiment of the invention accordingly comprises a connection instrument to connect an evacuation instrument onto the plunger opening of the syringe.

In order to achieve an inventive flow of the process gas through in the axial direction, it is furthermore particularly advantageous for the process gas to be delivered through the Luer cone on the opposite side from the plunger opening, or through the nozzle. The reverse configuration is nevertheless also possible, in which case the process gas is accordingly delivered through the plunger opening of the syringe body.

It may furthermore be expedient to carry out external coating of the workpiece. To this end, a device which is adapted for external coating of workpieces accordingly comprises an instrument for at least partially evacuating the surroundings of a workpiece in the reactor chamber. Like internal coating, the external coating may also be carried out by plasma coating. In this case, an instrument is provided for introducing process gas into the vicinity of the workpiece in the reactor chamber. Other coating methods, in particular PVD methods, for instance sputtering or evaporation coating, may nevertheless also be used. Possible functional layers are for example scratch protection layers, or hard material layers. Such functional layers are advantageous for example in the case of very scratch-sensitive cyclo-olefinic polymers and copolymers.

Absorbent or reflective coatings for particular wavelengths, preferably in the IR, visible or UV ranges, may furthermore be deposited. Inter alia, these may also have a decorative effect.

Many substrates, in particular plastics, age under exposure to ultraviolet light. Applying a selective reflection layer against TV irradiation or a TV absorber layer on the outer surface of the substrate makes it possible to prevent degradation of the substrate. A further applied scratch protection layer may protect the optical functional layer and the substrate against scratching. In a refinement of the invention, a UV reflecting and/or absorbing layer, which protects the content of the workpiece or the workpiece per se against degradation by ultraviolet light, may accordingly be deposited internally and/or externally.

According to another refinement of the invention, a coloring layer, preferably a blue-colored layer is deposited. Pharmaceutical products are often radiation-sterilized, for example with gamma radiation. Owing to the irradiation, the substrate (for example plastic or glass) changes its color impression. For example, plastics often experience yellowish discoloration under gamma irradiation. According to the prior art a dye, for example a blue dye, is therefore added to the plastic in order to compensate for this discoloration by a green hue which is acceptable on the market. According to the invention, this dye may be at least partially or entirely replaced by an optional functional layer, for example a layer design which causes a blue color impression, so as to similarly compensate for the yellow color impression after irradiation and discoloration of the plastic, or so that the color perception becomes much less than in the case of dyed plastics.

In order inter alia to obtain a more attractive appearance, a mirroring or blooming layer may furthermore be deposited. Like a coloring layer which reflects UV or infrared light, such a layer may also be deposited as a multilayer dielectric interference layer system.

The invention may very advantageously be used to treat a plastic surface of the workpiece, preferably a plastic workpiece. Plastics are being used more and more for pharmaceutical packaging, although in respect of various properties plastics are inferior for example compared with glass. For instance, the barrier properties of plastic are not comparable with glass, and plastics are more difficult to print on or coat with other plastics. These disadvantages may however be compensated for by suitable plasma treatments, in particular the deposition of suitable coatings or activation of the surfaces. Plastic surfaces of workpieces, which contain at least one of the following materials, are preferably treated: polycyclic hydrocarbons, for example cyclic polymers or copolymers, preferably cyclopolyolefinic copolymers or polymers, particularly preferably COC, preferably Topas® or COP (cyclo-olefinic polymer), in particular Zeonor®, polycarbonates, preferably autoclavable polycarbonates such as Apec® or particularly preferably Makrolon®, polyesters such as polyethylene terephthalate (PET) or PETG (glycol-modified PET copolyester), polystyrene, polyethylene such as MDPE (medium density polyethylene), but in particular HDPE (high density polyethylene) or LDPE (low density polyethylene), polypropylene and oriented polypropylene (o-PP), or biaxially oriented polypropylene (BOPP), polymethyl methacrylate, PES (polyether sulfone), polyethylene naphthalate (PEN), SAN (styrene-acrylonitrile copolymer), polymers containing fluorine, preferably polychlorotrifluoroethylenes (PCTFE), particularly preferably Aclar®, EVOH, polyamide, preferably Nylon6®, PVC, PVDC (polyvinylidene chloride), PMMI, PA, ABS, MABS, PMP, PSI.

Glass workpieces or glass surfaces of workpieces may also be plasma-treated by the invention. Glasses containing alkali metals, alkaline-earth metals or aluminum are preferred in this case, preferably borosilicate glasses, for instance Fiolax glass, and metallurgical glass, for example soda-lime glass. Besides glass workpieces, it is also possible to plasma-treat glass-ceramic or ceramic workpieces.

The device according to the invention is preferably adapted so that it can be integrated into a production line. In particular, the device may be operated at least partially in a sterile environment. In a further configuration, the device comprises a plurality of coating locations. These may be configured in a mobile fashion, so that the workpieces are inserted into reactors at a delivery position, the reactors are transported on a transport path to an extraction position and extracted there, the workpieces being plasma-treated between the delivery and extraction positions. Accordingly, a device for this configuration of the invention comprises reactors mobile along a transport path for the plasma treatment of workpieces, a delivery position for delivering the workpieces to the reactors, an extraction position for extracting the workpieces from the reactors, and a plasma treatment instrument between the delivery and extraction positions having an instrument for injecting electromagnetic energy into the cavity. The device is preferably configured as a rotary machine or as a linear machine. In the case of a rotary machine, the reactors are conveyed on a revolving transport path, for example on a carousel, while in the case of a linear machine the reactors are transported in a straight line between the delivery and extraction positions.

In order to be able to carry out simultaneous plasma treatment of a plurality of workpieces, in such a multilocation treatment device it has proven highly advantageous for the plurality of coating locations respectively to comprise separate energy sources for the provision of electromagnetic energy. It is also favorable for the device to comprise separate antechambers for the coating locations, which are connected to the coating zones and are joined to a common vacuum generation instrument, preferably through a further chamber, in which case instruments for exciting the process gas, which are respectively attached to separate second energy sources, are respectively arranged in the antechambers.

In order to inject electromagnetic energy into the process gas, according to another configuration of the invention the instrument for injecting electromagnetic energy comprises at least one of the instruments:
- a coaxial cable,
- a waveguide, preferably a rectangular waveguide,
- a slot for injection into a coating reactor,
- an antenna, which can be inserted into the cavity of a workpiece,
- a combination of the instruments above, preferably a rectangular waveguide and a coaxial cable connected thereto on the output side.

Since the field distribution is often critical, particularly in the case of workpieces with a narrow cross section of the cavity, it is furthermore recommendable to provide tuning elements for optimizing the injection. Accordingly, the instrument for injecting electromagnetic energy furthermore preferably comprises at least one of the tuning elements: a stub tuner (3-pin tuner), a short-circuit slider, displaceable components which modify the electromagnetic field distribution.

The aforementioned tuning elements and injection instruments are suitable in particular for microwave sources as energy sources for generating the plasma in the process gas. Besides a microwave source, it is nevertheless also possible to use a high-frequency source (HF source) or radiofrequency source (RF source). Microwaves are in this case intended to be understood as electromagnetic waves with a frequency above 1 GHz. For high-frequency sources (HF source) or radiofrequency sources (RF source), electrodes may be used to inject electromagnetic energy into the cavity, in which case energy is injected by applying an (alternating) current to the electrodes. Impedance matching instruments, for example a matchbox with a control circuit and variable impedances (capacitors or inductors) may also be provided for HF or RF sources.

Inter alia carrier or reaction gases, such as carrier gases containing oxygen or nitrogen or containing hydrogen, preferably from the group oxygen, ozone, nitrogen, ammonia, nitrogen oxides, hydrogen, may be used as process gases.

In order to deposit coatings, the following process gas components are preferably used:
inorganic or organic silicon compounds, preferably HMDSO or HMDSN, or TMDSO or TMCTS or TEOS or TMS or $SiCl_4$, $SiH_4$ or tetraisocyanatosilane,
organic or inorganic aluminum compounds, preferably aluminum chloride,
organotitanium compounds, preferably TIPT,
inorganic titanium compounds, preferably $TiCl_4$,
hydrocarbons, preferably acetylene, methane, propane, butane, fluorine compounds, preferably fluorinated hydrocarbons, noble gases such as argon, helium, xenon, krypton.

A device according to the invention in this case preferably comprises a gas supply instrument having at least two containers for different gases, the mixture of which is used for the plasma treatment.

In order to avoid ignition of a plasma in the feed lines to the reactor chamber, according to a refinement of the invention a shield for the electromagnetic energy is provided to decouple the feed line of the reactor chamber to the evacuation instrument.

In a preferred configuration, the device furthermore comprises an antechamber before the reactor space, the evacuation instrument being connected to the antechamber. With such an antechamber, the device can be adapted rapidly for different workpieces to be coated by mounting respectively adapted holding instruments on the antechamber.

The device may for example comprise an antechamber or subspace before the reactor space as a component of the delivery line. This will then be at least partially decoupled from the reactor space by the shielding. The decoupling is carried out for example using an electrically conductive separating piece. Inter alia a grid or a metal body with gas inlets is possible for this.

Decoupling means in particular that no energy for the production/coating process employed reaches the subspace before the reactor space, or only so little energy that a plasma cannot be ignited there by the energy source.

Decoupling of the gas source may likewise be carried out. The gas is discharged into the reactor space, to and through the antechamber or subspace or otherwise configured feed lines to the evacuation instrument. After ignition of the plasma in the cavity of the workpiece, the substance concentration of the starting gas in the subspace is then significantly reduced, so that a plasma can no longer be ignited in the feed lines, particularly in the antechamber. In general, a combination of shielding the electromagnetic energy and the gas decrease in the feed lines is used so that coating can primarily take place only in the reactor space, i.e. the subspace is coated not at all or significantly less than the workpiece.

It has surprisingly been found that reliable ignition of the plasma is achievable by such an ignition instrument, which is not in fact arranged in the region of the plasma thereby ignited. Such an ignition instrument may generally also be used in other reactor types and methods for the plasma treatment of workpieces. Accordingly, the invention also provides a method for the plasma treatment of workpieces in which at least one zone of a reactor chamber is at least partially evacuated, a process gas is introduced into the zone and a plasma is generated by means of injected electromagnetic energy in the vicinity of at least a part of the surface of the workpiece in the process gas being introduced, the plasma being ignited by excitation of gas in a space separate from the reactor chamber while the electromagnetic energy for generating the plasma is injected into the process gas being introduced.

Accordingly, the invention also provides a method for plasma treatment of workpieces in which at least one zone of a reactor chamber is at least partially evacuated, a process gas is introduced into the zone and a plasma is generated by means of injected electromagnetic energy in the vicinity of at least a part of the surface of the workpiece in the process gas being introduced, the plasma being ignited by excitation of gas in a space separate from the reactor chamber. In particular, the plasma may be ignited by excitation of gas in a space separate from the reactor chamber while the electromagnetic energy for generating the plasma is injected into the process gas being introduced, in which case the excitation leads to the formation of energetic species in the form of excited particles and energetic radiation and assists the ignition of the plasma.

A corresponding device, in particular for carrying out this method, accordingly comprises a reactor chamber for receiving a workpiece to be coated, an instrument for at least partially evacuating at least one zone of the reactor chamber, an instrument for injecting electromagnetic energy into the reactor chamber as well as a space separate from the reactor chamber, and an instrument for igniting the plasma in the reactor chamber, the ignition instrument comprising an instrument for exciting gas in the space separate from the reactor chamber.

A glow discharge is preferably ignited in the separate space in order to ignite the plasma. By means of an instrument for generating a glow discharge in the space separate from the reactor space, gas can be highly excited in a particularly straightforward way. In order to ignite such a glow discharge, for example, an ignition electrode may be provided to which a high voltage is preferably applied as a DC or AC voltage The voltage is applied either before the plasma treatment, or at the latest at the start of the coating, and it leads to ignition of the glow discharge. This glow discharge on its own does not yet however ignite a plasma in the reactor; rather, excited species are provided in the zone in which the plasma is intended to be ignited. This may be done both by ions, electrons, excited neutral particles diffusing from the glow discharge, and by photoionization due to UV light which results from the glow discharge. Easier ignition of the plasma is facilitated owing to the free charge carriers.

Only by applying the energy from the energy source, for instance a microwave source, does ignition of the plasma take place. In a refinement of the invention, the glow discharge may be controlled by a preferably optical monitoring instrument.

The glow discharge is in this case preferably ignited by one of the following parameters:
i) a high voltage in the range of 0.1 kV-100 kV
ii) an alternating current with a frequency of 0.2 kHz-100 MHz, preferably 1 kHz-100 kHz.
iii) an rms alternating current in the range of 0.01 mA-2A, preferably in the range of from 0.1 in A to 500 mA.

The separate space is particularly preferably connected to the reactor chamber by vacuum technology. This space may in particular be an antechamber as described above, through which the reactor chamber is connected to the evacuation instrument. For separation, shielding may be provided which prevents microwaves from entering the antechamber and/or the feed lines to the evacuation instrument.

Roots pumps and rotary disk pumps are preferably used as components of the evacuation instrument, and also turbomolecular, oil diffusion or cryo pumps for lower pressures to be achieved, for instance for PVD coatings.

In order to control the plasma treatment process, in a refinement of the invention and the light emission of the antechamber and/or the treatment chamber may be measured. To this end a photodiode may respectively be used. A wavelength filter may be used to filter out certain characteristic emission lines of the plasma or of a glow charge for igniting the plasma. When workpieces in the form of hollow bodies are being treated, then the interior of the workpiece and its surroundings in the reactor chamber may be monitored separately in the reactor chamber. Particularly for small workpieces, such as typical pharmaceutical packaging, a compact arrangement may also be selected in which the light emitted by the plasma is sent through a glass fiber or a glass fiber bundle to an optical detector.

Particularly for the treatment of small workpieces, for example pharmaceutical products such as syringe bodies, vials, blood sampling tubes or carpules, a particularly compact arrangement may furthermore be achieved when the instrument for injecting electromagnetic energy into the reactor chamber comprises a coaxial cable, the coaxial cable comprising an axially extending channel through which the process gas can be delivered. At the same time, therefore, the electromagnetic energy can be delivered through the coaxial cable and process gas can be delivered through its inner conductor. Additional arrangement of a gas delivery may be obviated in this way. In an alternative refinement of the invention, the electromagnetic energy may also be injected through a coaxial cable and the treatment zone may be evacuated through the coaxial cable. In another configuration another ignition instrument, particularly an ignition electrode for generating a glow discharge, may also be provided in the channel through the inner conductor. It is particularly preferable to arrange the coaxial cable in the axial direction of the workpiece to be treated, so that the coaxial cable extends in the axial direction of the workpiece. In the case of a cylindrical or quasi-cylindrical workpiece, for instance a syringe body, the coaxial cable therefore preferably extends in a direction along the mid-axis of the cylinder of the syringe body. In this way, a maximally symmetrical field distribution is accordingly achieved in or on the syringe body.

A filler body may furthermore be provided, which at least partially fills a cavity of a workpiece to be treated. By at least partially filling a cavity of a workpiece to be treated with a filler body, the temperature distribution on the workpiece can be kept more uniform during and after the plasma treatment, compared with a plasma treatment without such a filler body. The filler body may at the same time be a fixing and/or vacuum sealing element for a further cavity of the workpiece. In some syringe bodies, for example, there is an edge which encloses the Luer cone or the nozzle and forms a cavity. Under certain circumstances, an undesirable plasma may also be formed in this cavity. This effect can be prevented by such a filler body. In particular, to this end the filler body may be designed to absorb or reflect high-frequency electromagnetic energy. The filler body in this case preferably prevents ignition of a plasma in the immediate vicinity of the filled zone. Inter alia polymer, ceramic or metallic materials are suitable for the filler body—optionally in combination. At the same time, the filler body may seal the cylinder of the syringe body as a further cavity and/or fix the workpiece, so that the filler body acts as a sealing or fixing element. In particular, such a filler body may be integrated into a coaxial inner conductor. The filler body need not be a separate part in this case, and it may also be formed at least partially by a section of the inner conductor material. Inter alia rigid polymers, for example PTFE, POM or polycarbonate are suitable as plastics for the filler body. If the filler body is also intended to act as a sealing element, then elastomers such as silicone, bromobutyl elastomer or polyisoprene-bromobutyl elastomer, may in particular also be used in addition or as an alternative.

Surprisingly, it could furthermore be shown that the plasma deposition of functional layers on pharmaceutical packaging with a narrow cross section, for example syringe bodies, vials, blood sampling tubes or carpules, could be achieved with very low average powers. In particular, such containers could be coated in a pulsed plasma with average powers of at most 300 watts, or even at most 100 watts.

As an alternative or in addition, the workpiece may also be cooled by a gas flow during the plasma treatment. If internal coating is carried out, for example, the workpiece may be cooled externally by a gas flow—in the simplest case a flow of air at atmospheric pressure. Also in the case of external coating, cooling may likewise be carried out by passing a gas flow through the cavity of the workpiece.

The invention will be explained in more detail below with the aid of exemplary embodiments and with reference to the appended drawings. References which are the same in the drawings denote parts which are identical or similar.

Figure 2:
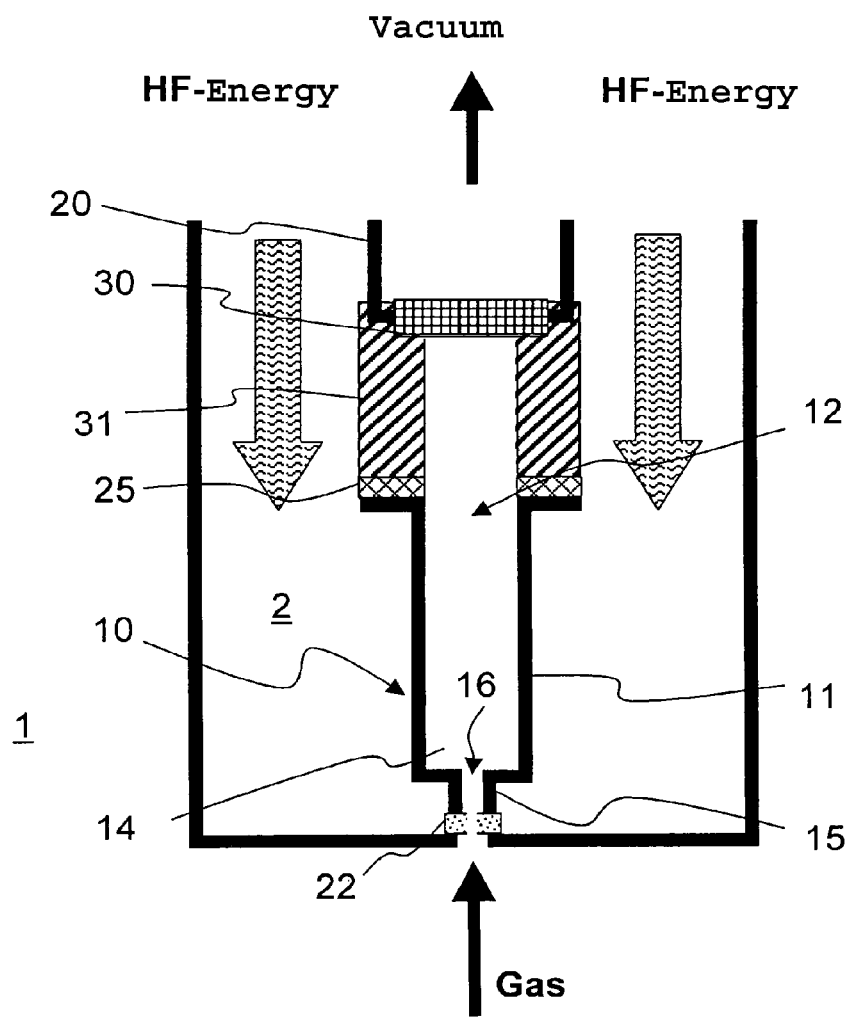
Figure 3:
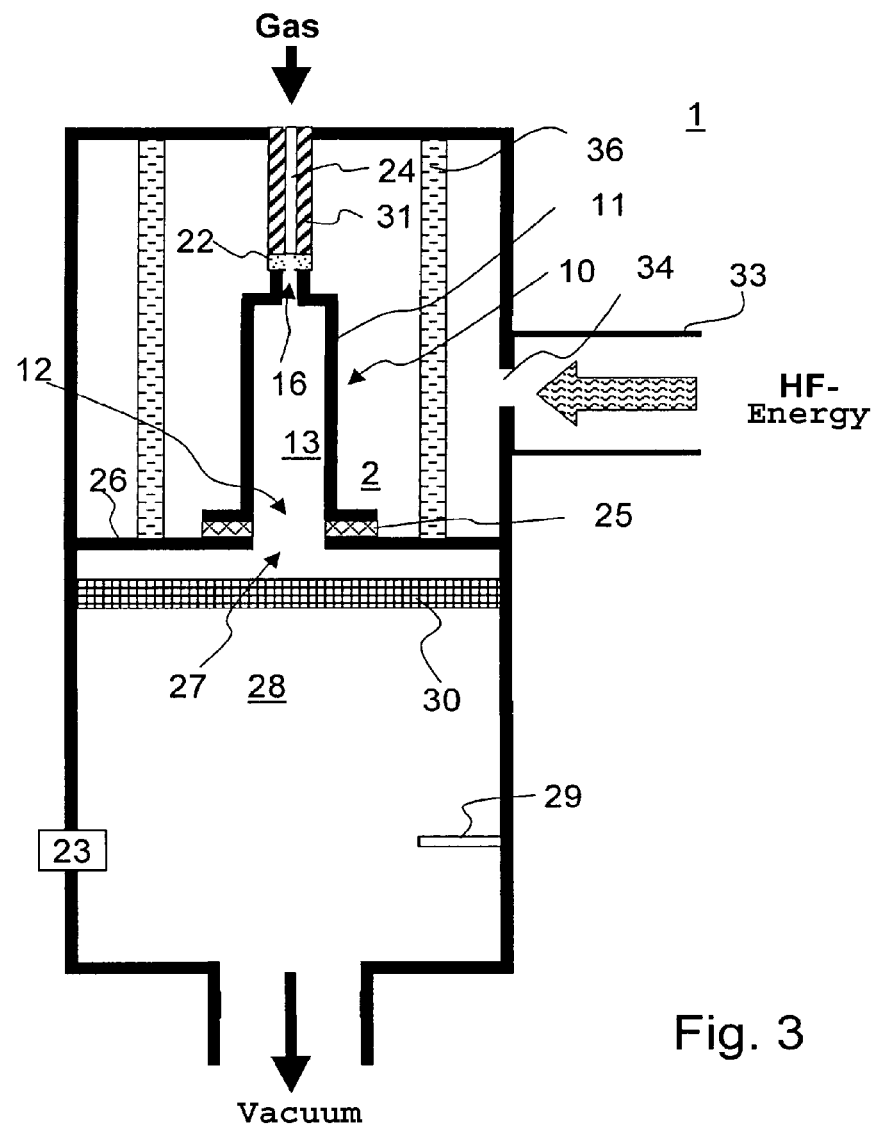
Figure 4:
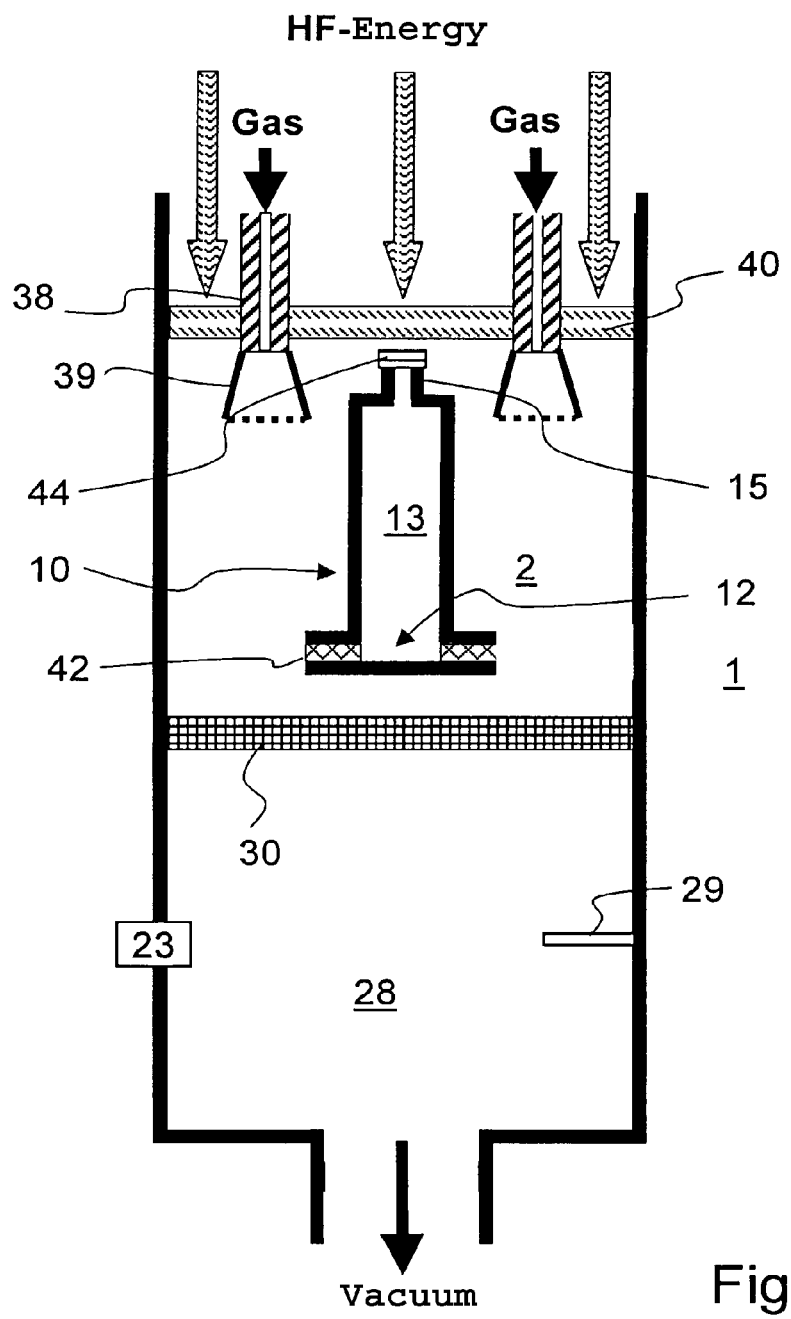
Figure 5:
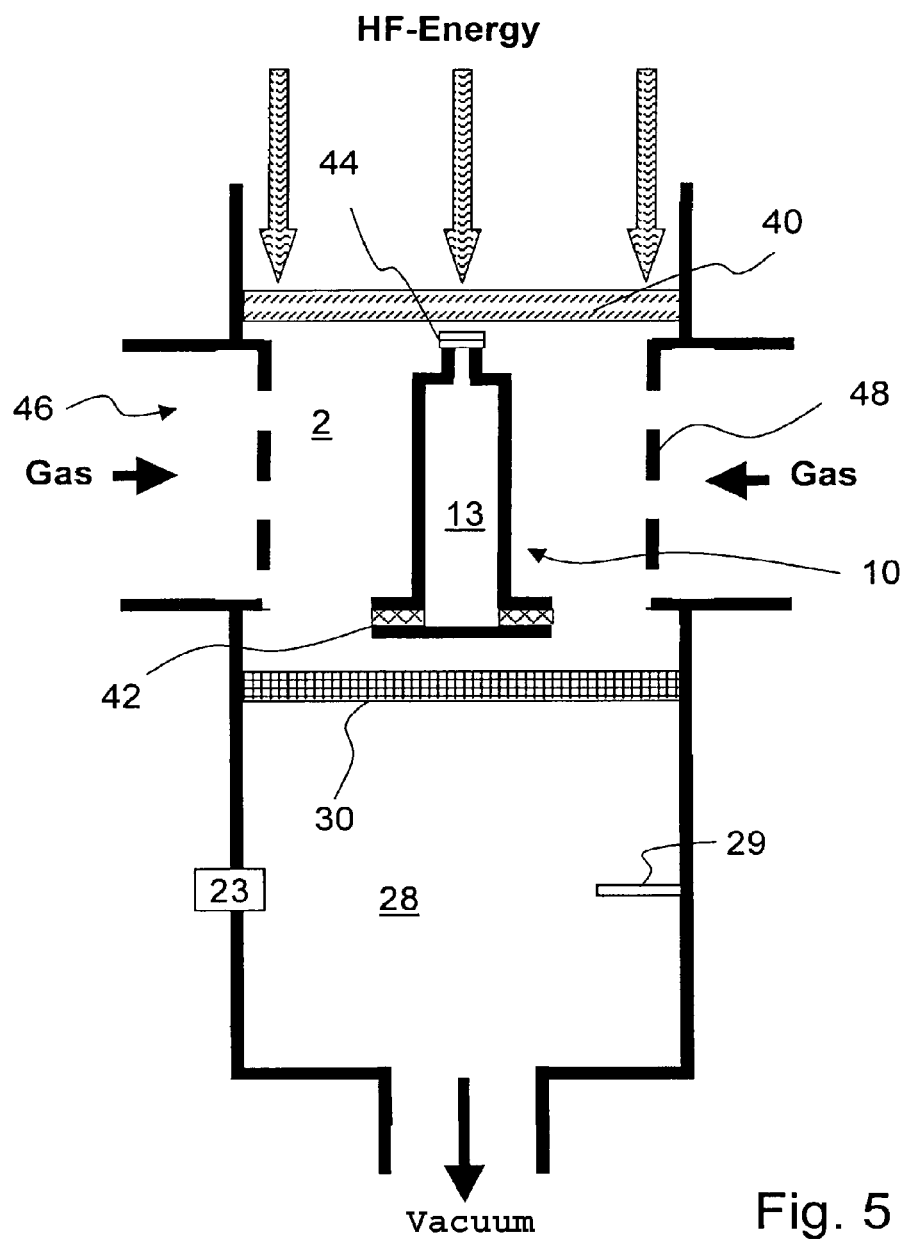
Figure 6:
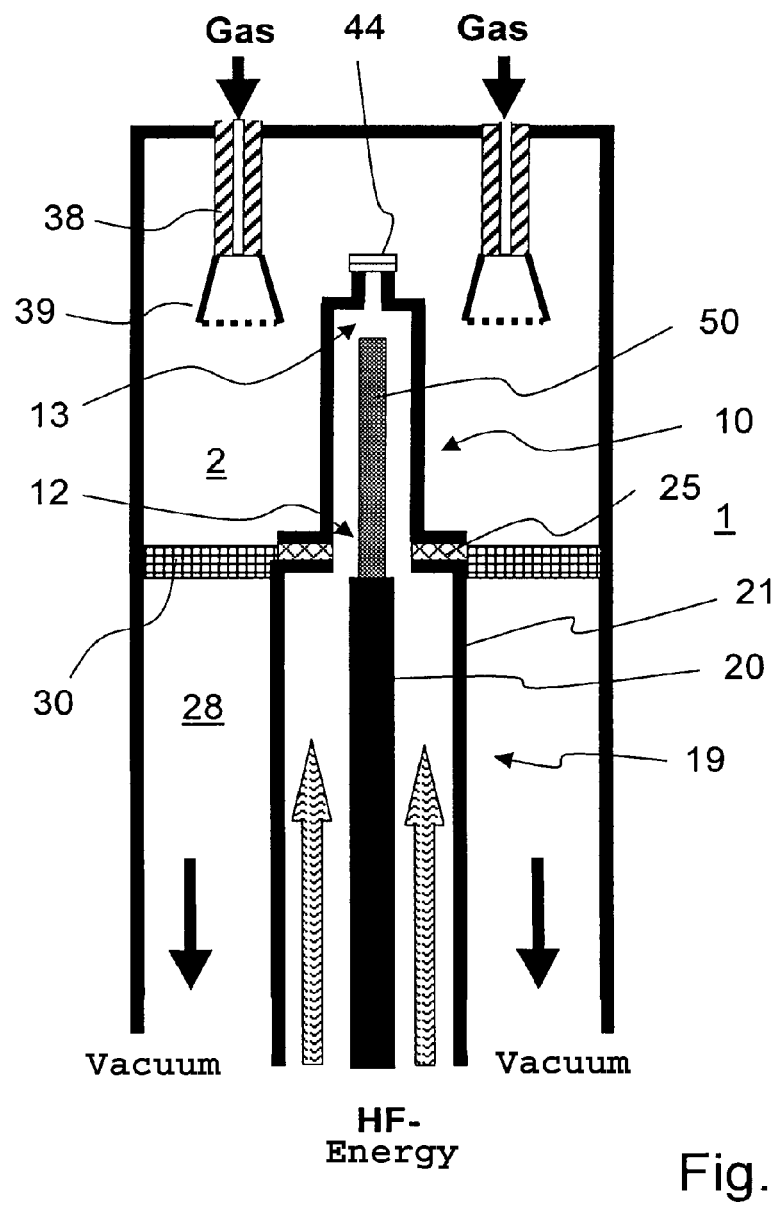
Figure 7:
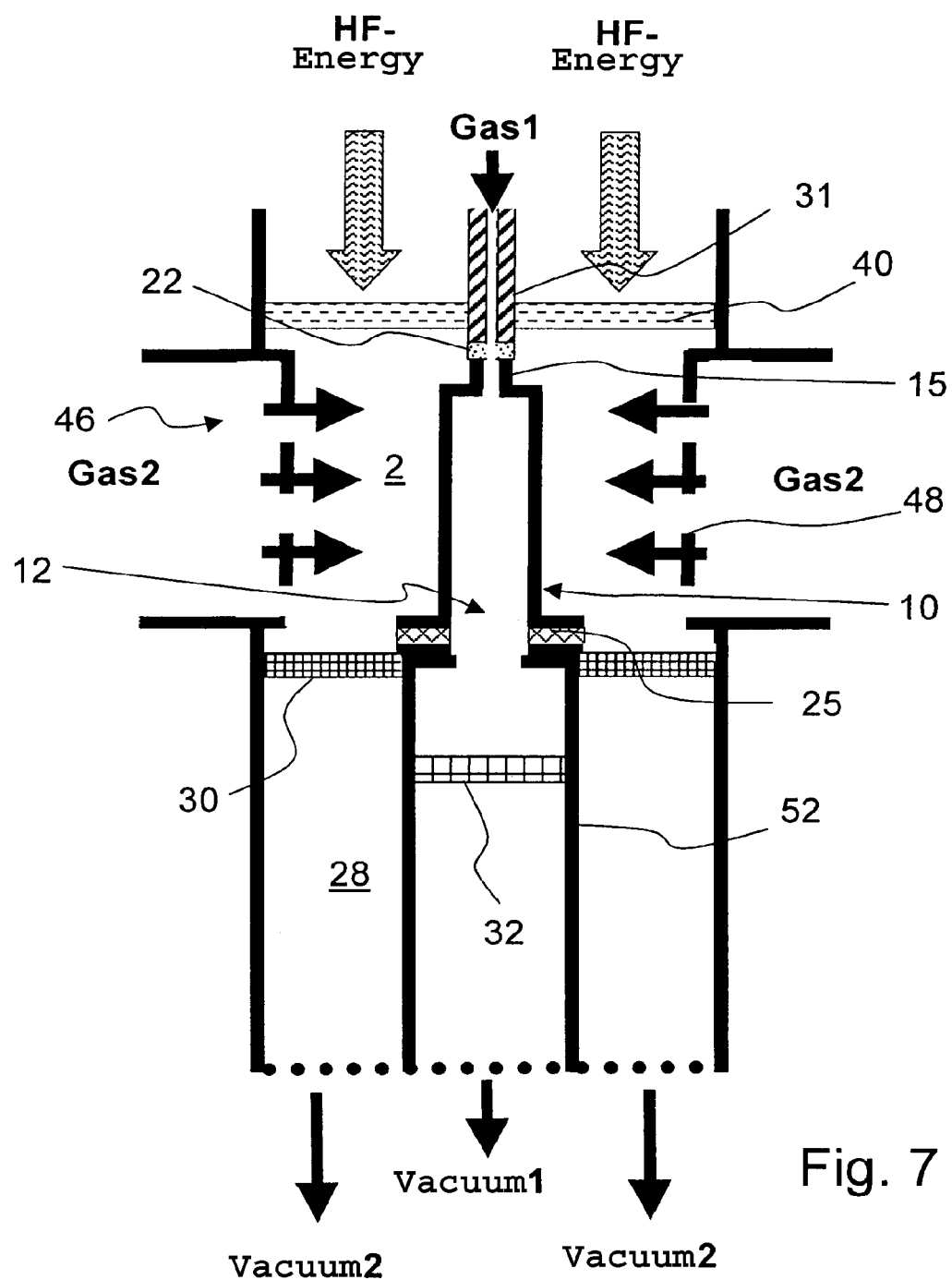
Figure 8:
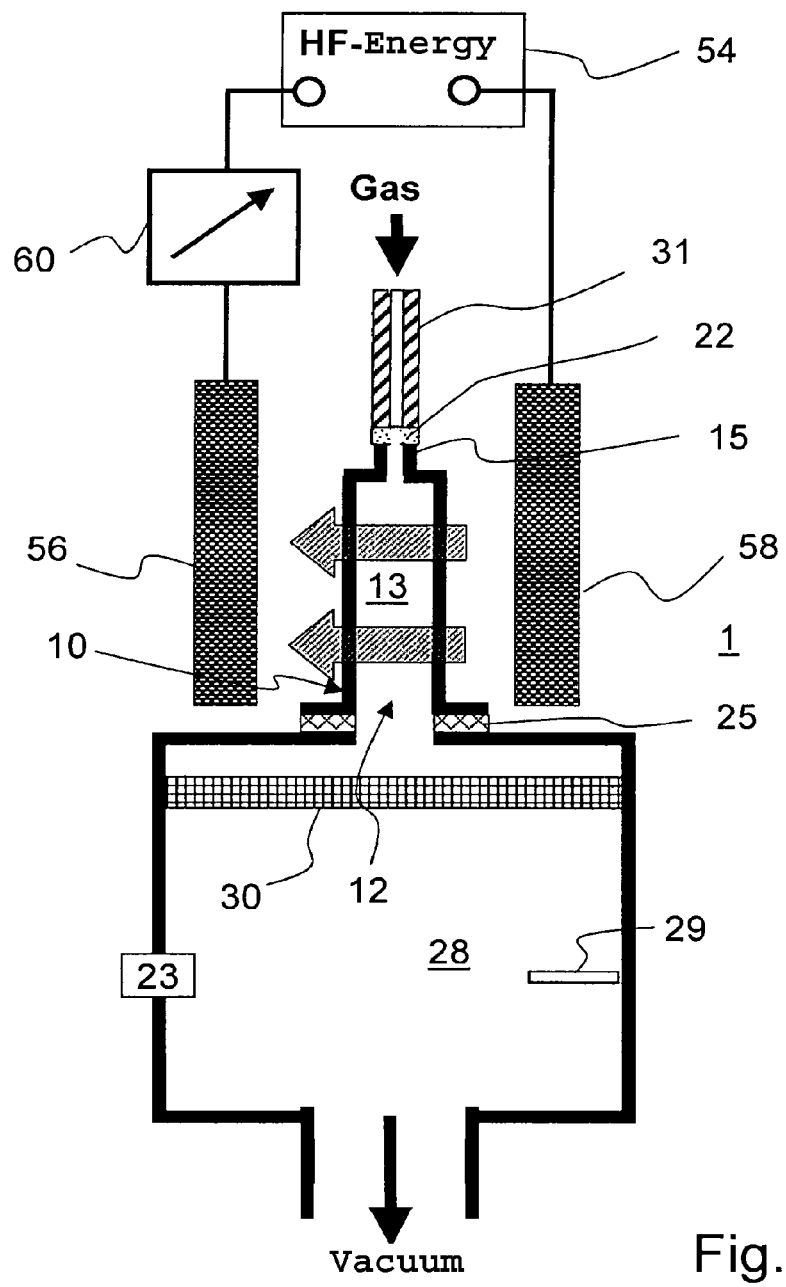
Figure 9:
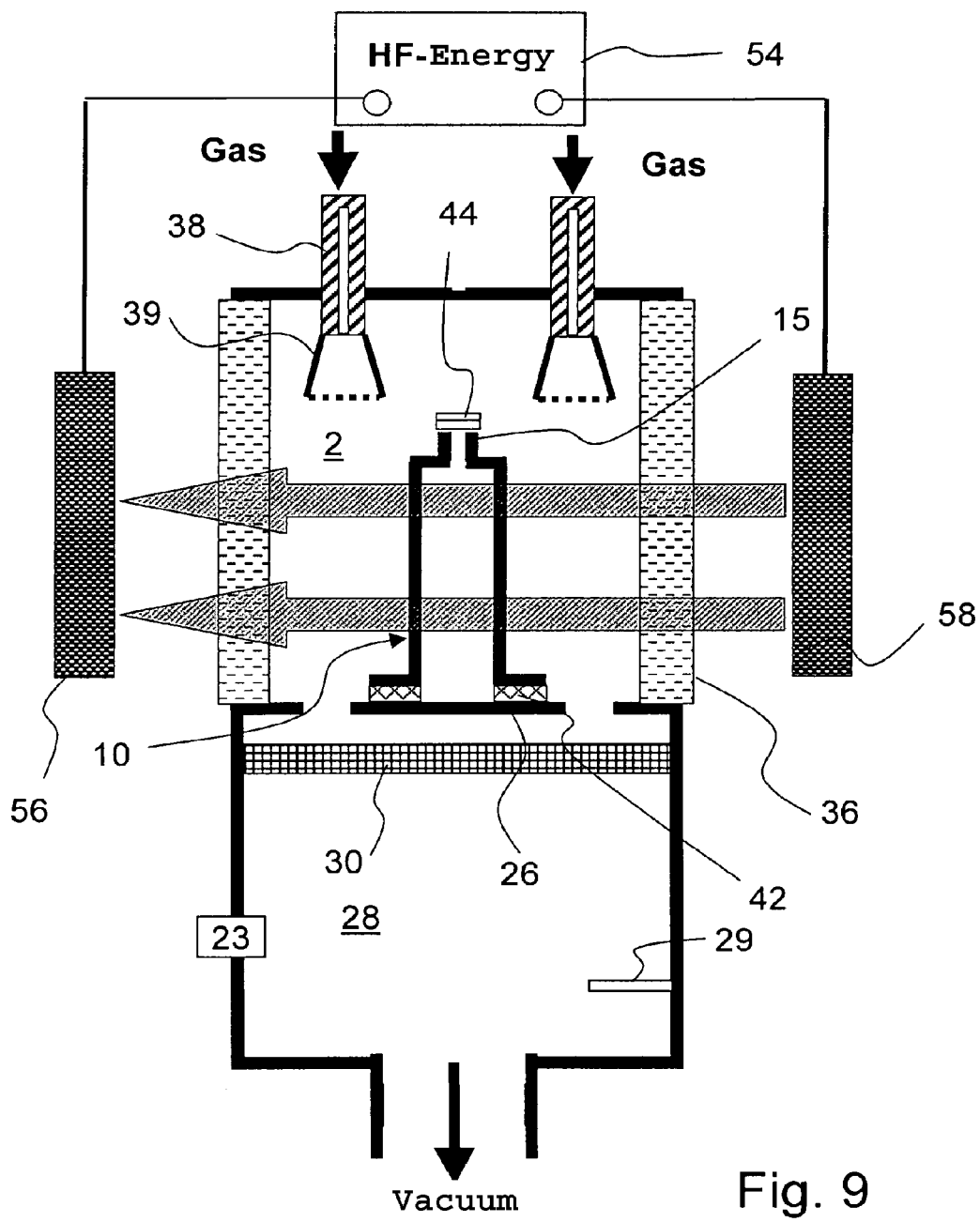
Figure 10A:
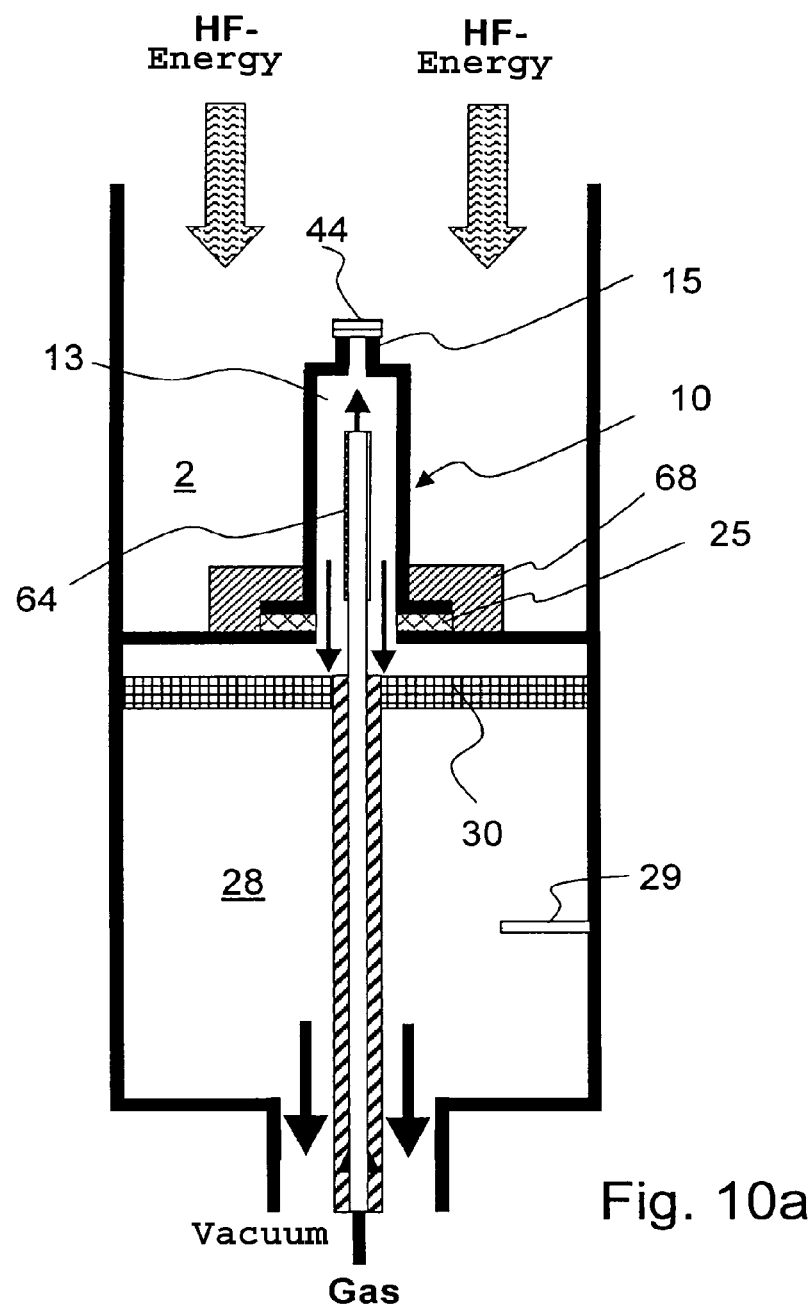
Figure 10B:
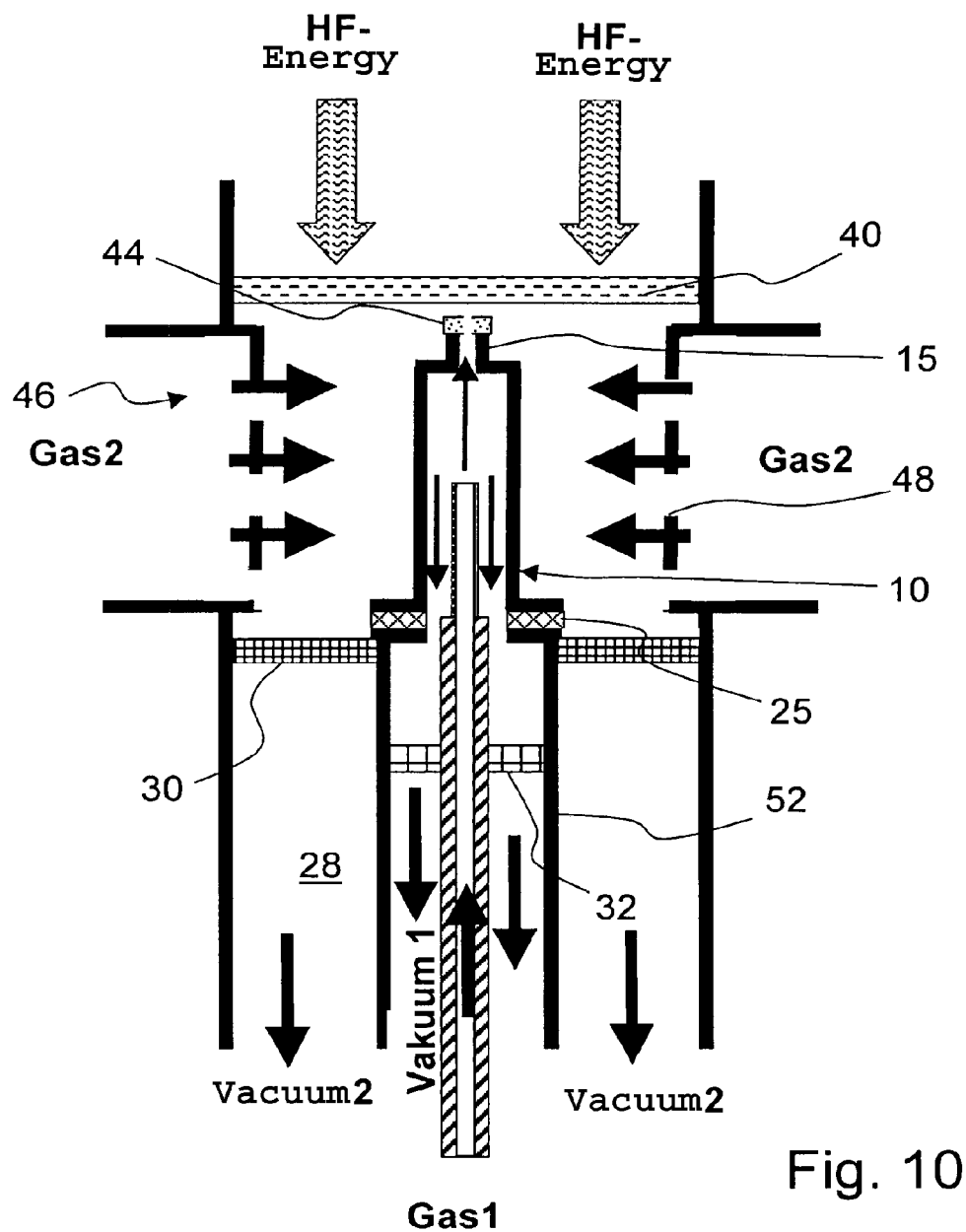
Figure 14:
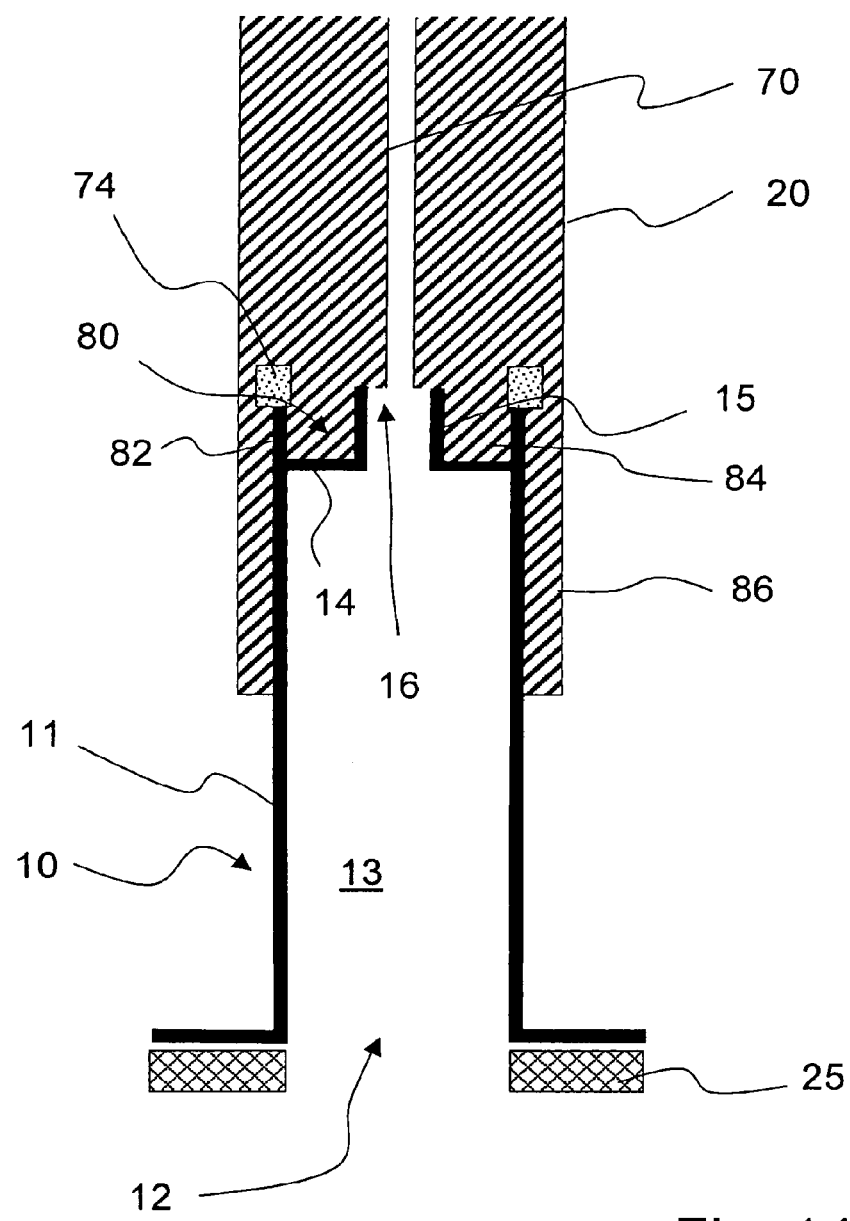
Figure 15:
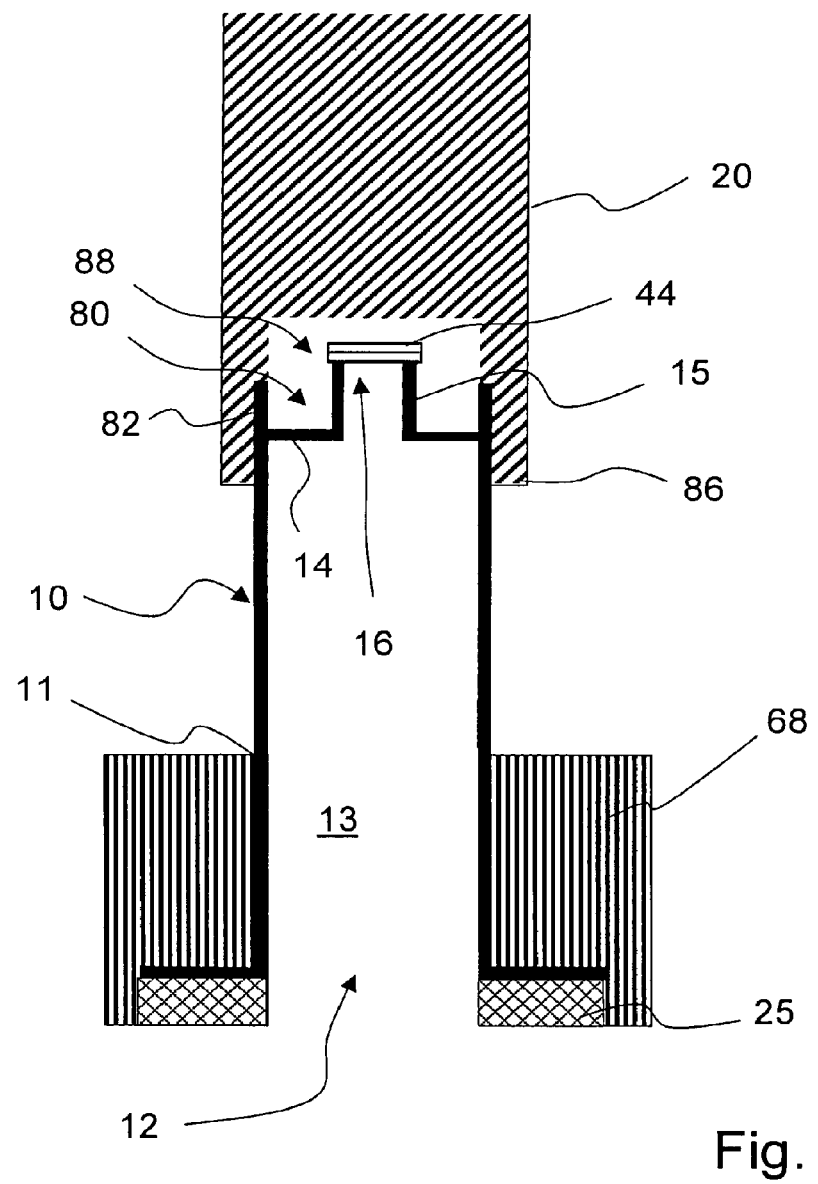
Figure 16:
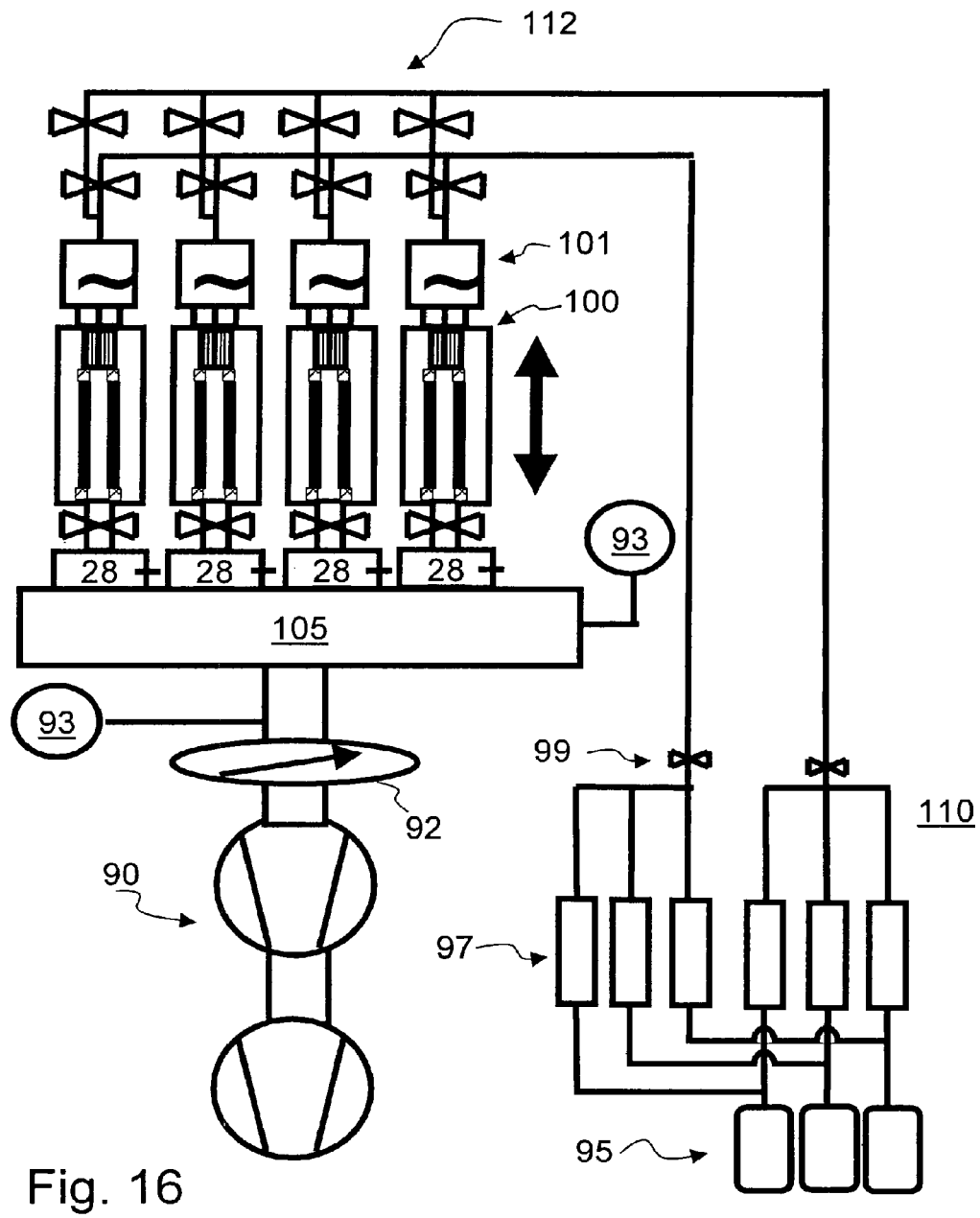
Figure 17:
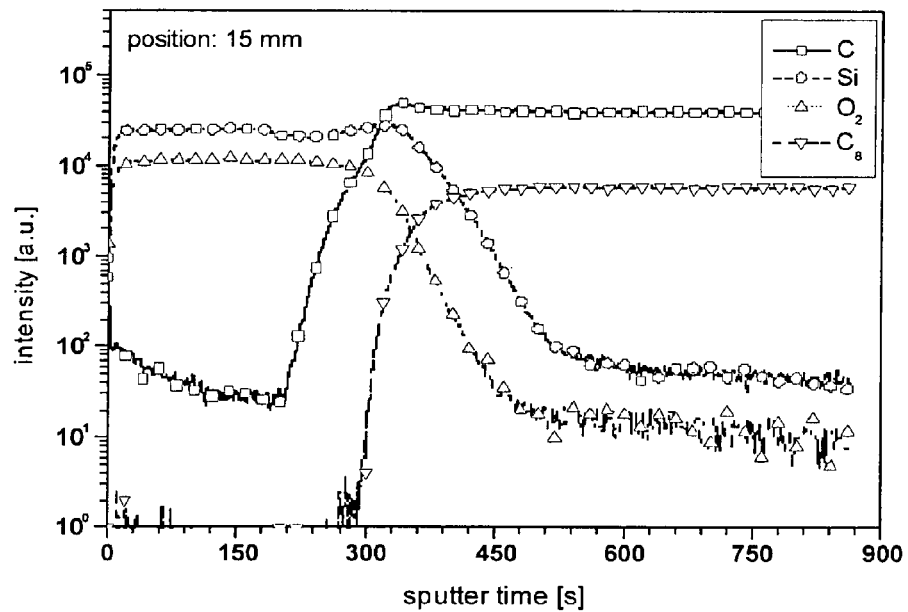
Figure 18:
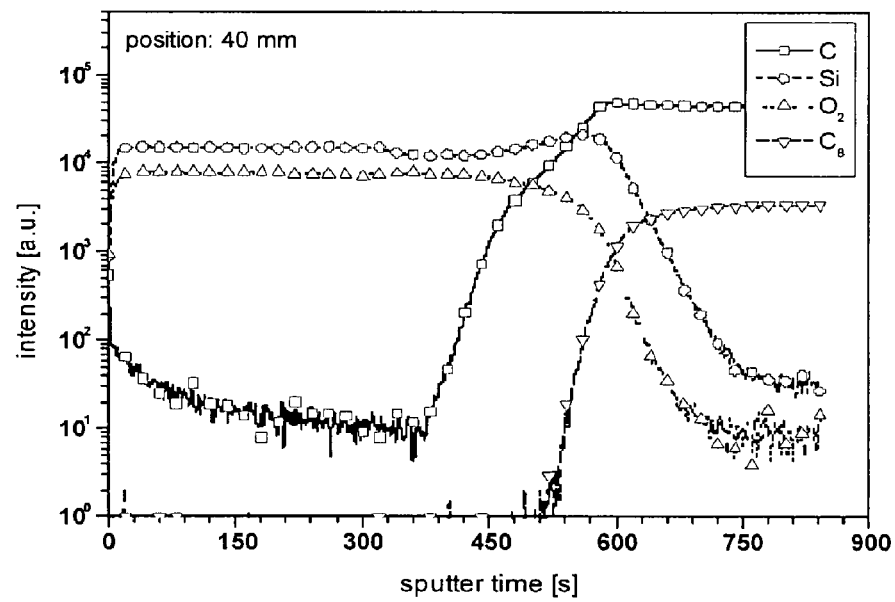
Figure 19:
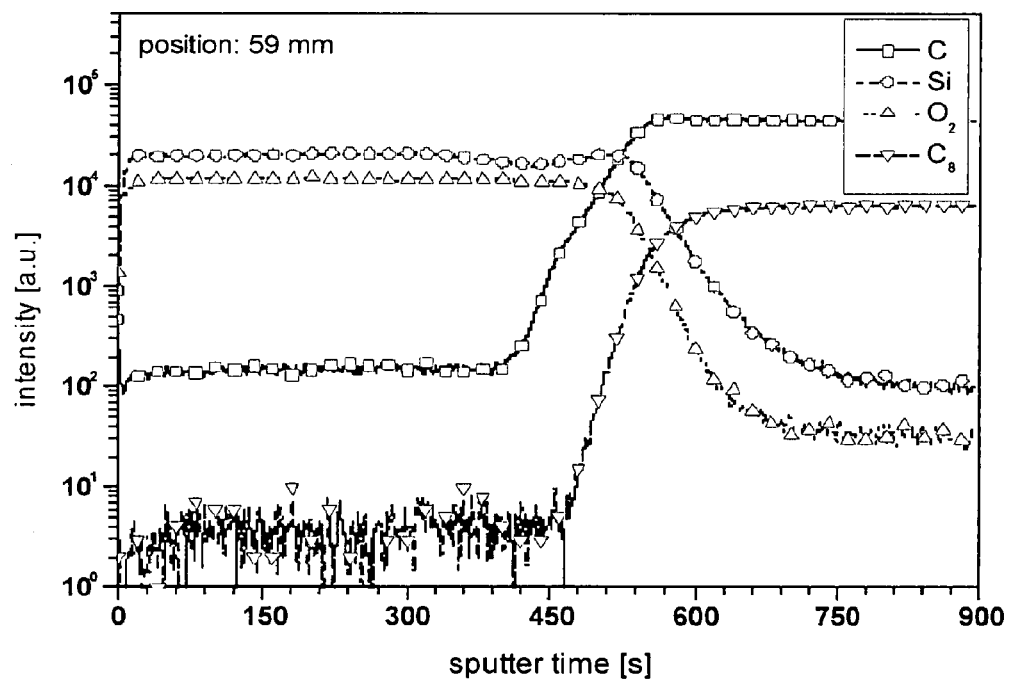

FIG. 1 shows a schematic cross-sectional view of an example of a through-flow reactor according to the invention, FIGS. 2 and 3 show alternative arrangements to the through-flow reactor shown in FIG. 1, FIG. 4 shows a through-flow reactor for external coating, FIGS. 5 to 7 show variants of the reactor represented in FIG. 4, FIG. 8 shows a variant of the examples shown in FIG. 1 or 3 with electrodes for feeding in the electromagnetic energy, FIG. 9 shows a variant of the reactor shown in FIG. 8 for external coating, FIGS. 10a, 10b show two exemplary embodiments of reverse flow reactors, FIGS. 11-15 show details of coaxial inner conductors for delivering electromagnetic energy, FIG. 16 shows an exemplary embodiment of a multilocation coating system, FIGS. 17 to 19 show SIMS intensity-sputter time profiles for the elements/molecules C, $O_2$, Si and for the C8 chain of the coated COC syringe, coated with a 2-layer system comprising an adhesion promoter layer and a barrier layer. The profile shape corresponds to the sequence: inorganic barrier layer, adhesion promoter layer containing carbon, polymer substrate (cyclo-olefinic copolymer).

In what follows, a through-flow reactor is intended to mean a device according to the invention in which a treatment zone is at least partially evacuated in a reactor chamber, a process gas is introduced into the cavity of the workpiece and a plasma is ignited by means of injected electromagnetic energy in the process gas introduced into the treatment zone, the process gas flowing through the treatment zone between opposite ends of the zone during the plasma treatment.

In the context of the invention, a reverse flow reactor is furthermore intended to mean a reactor in which the process gas is put in not at a further opening, opposite to the opening at the first end connected to the vacuum system, but inside the cavity to be coated. In this case, however, the position at which the gas flows in preferably lies at least ⅔ of the longitudinal extent of the cavity away from the opening at the first end of the workpiece. The process gas is in this case preferably put in using a cannula inserted into the cavity.

FIG. 1 shows a schematic cross section of a through-flow reactor 1, which is designed for the internal coating of workpieces in the form of hollow bodies. In particular, the reactor 1 is adapted for the coating of pharmaceutical packaging, for instance syringe bodies or carpules. To this end, FIG. 1 shows a syringe body 10 arranged in the reactor chamber 2 of the reactor 1. The syringe body 10 comprises a cylinder 11, which opens into a plunger opening 12 and encloses a cylindrical cavity 13. At the opposite end of the cylinder 11 from the plunger opening, it is provided with a cover element 14 having a second cylindrical or quasi-cylindrical, for example slightly conical appendage with a smaller diameter and a shorter length in the form of a Luer cone 15 with a second opening 16. When the syringe is being used, the cannula is fitted onto the Luer cone 15. The length and height of the Luer cone 15 are preferably at least 20% less than the maximum diameter and the height of the syringe body 10. The Luer cone 15 has a narrow, cannula-like inner diameter of between 0.01 and 15 mm, particularly preferably between 0.05 and 4 mm.

The device 1 represented in FIG. 1 is designed in particular for the internal plasma treatment of such syringe bodies 10. The material of the syringe body 10 at least locally has dielectric properties in this case. The syringe body is shaped cylindrically or quasi-cylindrically, and typically has a maximum outer diameter of between 1 mm and 50 mm, preferably between 3 mm and 30 mm, and a height of from 10 mm to 200 mm, preferably from 30 mm to 150 mm.

In this example, the electromagnetic energy for generating a plasma is delivered by means of a coaxial cable, FIG. 1 showing only the inner conductor 20 of the coaxial cable. Using the inner conductor 20 and a sealing element 22 attached thereto, the syringe body 10 is both fixed and sealed off from the surrounding regions of the reactor chamber 2. In this embodiment of the invention, in particular, the electromagnetic energy is delivered through the coaxial cable and the process gas is delivered through an axially extending channel 24 in the inner conductor 20 of the coaxial cable.

The inner conductor 20 furthermore presses the syringe body 10 onto a further sealing element 25, which encloses an opening 27 in a separating plate 26. By means of the separating plate 26, the reactor chamber 2 is separated from an antechamber 28 connected to an evacuation instrument (not shown). The sealing element 25 around the opening 27 in the base plate in this case accordingly forms a connection instrument to connect an evacuation instrument, for at least partially evacuating the cavity 13 of the workpiece 10, onto the plunger opening of the syringe.

As can be seen from FIG. 1 the cavity of the syringe body 10 is evacuated through an opening at a first end—here accordingly the plunger opening 12—and the process gas is introduced through a further opening, i.e. the opening 16 in the Luer cone 15—at a second end of the syringe body 10, which lies opposite the first end. During the coating, the process gas therefore flows through the cavity 13 in an axial direction along its entire length. Owing to the axisymmetric arrangement of the Luer cone 15, the cylinder wall and the plunger opening, an axisymmetric flow of the process gas takes place through the cavity 13 of the syringe body 10.

The plasma in the treatment zone, i.e. here the cavity 13, is furthermore ignited by means of an ignition instrument. The ignition instrument comprises an instrument for exciting gas in the antechamber 28 separated from the reactor chamber. In particular, the ignition instrument is in this case an ignition electrode 29 arranged in the antechamber 28, by which a glow discharge is ignited and gas contained in the antechamber is thereby excited. Ignition in the coating zone i.e. here the interior of the syringe body 10, can however take place only if electromagnetic energy, for example microwaves with a frequency of 2.45 GHz, is simultaneously injected through the coaxial cable. Astonishingly, ignition by the glow discharge burning in the antechamber 28 takes place even though the antechamber 28 and the reactor chamber are separated from each other by the separating wall 26, and the gas flow travels in the opposite direction owing to the evacuation. Another shield 30 for the electromagnetic energy is furthermore provided to decouple the feed line of the reactor chamber 2 to the evacuation instrument, which suppresses entry of the electromagnetic waves into the antechamber 28 in order to avoid ignition of a plasma in this region. Ignition by means of the glow discharge is unaffected, or at least not substantially affected, even by such shielding. A monitoring instrument 23 may advantageously be used to check whether a glow discharge has been ignited. It may for example comprise one or more photodiodes, which optically record the light of the glow discharge.

FIGS. 2 and 3 represent alternative arrangements of a through-flow reactor 1 as shown in FIG. 1.

In the example represented in FIG. 2, the process gas is likewise delivered through the Luer cone 15, i.e. the narrower of the two openings 12, 16. The connection instrument for connecting the treatment zone in this embodiment of the invention, here likewise the interior 13 of the syringe body 10, comprises a connection element 31 connected to the inner conductor 20 of a coaxial cable and having a sealing element 25, which seals the plunger opening 12 of the syringe body 10 off from the rest of the reactor space 2. The process gas is accordingly not delivered through the coaxial cable in this case, rather it is discharged, and the interior of the syringe is evacuated, through this.

In the example represented in FIG. 3, the electromagnetic energy is fed through with a waveguide 33, preferably a rectangular waveguide and a gap 34 opening into the reactor space 2, instead of a coaxial cable. A dielectric tube seals the inner part of the reactor chamber 2 with the syringe body 10 off from the outer part, while the electromagnetic waves emerging from the gap 34 can pass through the tube 36. Instead of or in addition to the dielectric tube 36, it is also possible to use a dielectric window in the gap 34. The injection of electromagnetic waves takes place not in the axial direction of the syringe body 10 here, but instead laterally. An HF or RF source is preferably used in conjunction with the waveguide.

The Luer cone 15 of the syringe body 10 is connected hermetically by a connection element 31 and a sealing element 22 to a gas supply. In other regards, the structure with an antechamber 28 connected to an evacuation instrument, an ignition electrode 29 and a shield 30, is similar to the example represented in FIG. 1.

FIG. 4 shows a variant of a through-flow reactor 1 for the external coating of workpieces. Here again a syringe body 10 is represented as a workpiece to be coated, although other types of workpieces, even workpieces not in the form of hollow bodies, may also be plasma-treated, in particular plasma-coated by such an arrangement. For the external coating, the syringe body is sealed off both at the plunger opening and at the Luer cone by sealing elements 42 and 44, respectively, from the rest of the reactor space 2 which in this case constitutes the treatment zone. In particular, the cavity 13 of the syringe body 10 may remain at atmospheric pressure during a plasma treatment, while the surrounding reactor space 2 is evacuated through the evacuation instrument connected to the antechamber 28.

In this example, the antechamber 28 is separated from the reactor space 2 not by a separating wall, but only by a shield 30.

The process gas is introduced into the treatment zone via two or more supply channels 38 with gas distributors 39 connected thereto, and it is sucked through the shield 30 and the antechamber 28 by the evacuation instrument. The electromagnetic energy is delivered from the same direction as the process gas in this example. A dielectric window 40 seals the reactor chamber 2 hermetically, but transparently for the electromagnetic waves being introduced. In this example as well, the process gas flows through the treatment zone between two opposite ends.

FIG. 5 shows a variant of the example represented in FIG. 4. In this variant, the process gas for an external treatment, for example external coating of the workpiece, is delivered laterally. To this end lateral openings 46 are formed in the reactor chamber 2, and they are provided with shields 48 against entry of the electromagnetic waves into the gas delivery system. As an alternative or in addition, the shields may also act as gas distributors.

The variant represented in FIG. 6 is again designed as a through-flow reactor. The gas delivery and the vacuum system with an antechamber 28 and a shield 30 correspond to the example represented in FIG. 4. In contrast to the example shown in FIG. 4, however, microwave energy is delivered through a coaxial cable 19 with an inner conductor 20 and an outer conductor 21. The syringe body is connected hermetically by means of a sealing element 25 to the waveguide 19 by the plunger opening 12. An antenna 50, which is inserted into the cavity 13 of the syringe body 10, is connected to the inner conductor 20 of the waveguide 19. The antenna 50 ensures better introduction and more homogeneous distribution of the electromagnetic fields.

FIG. 7 shows a reactor 1, which is designed both for internal and for external coating of the syringe body 10. The internal coating is carried out in this case with a process gas flowing through between opposite ends of the inner treatment zone, i.e. the cavity 13 of the syringe body. In particular, the Luer cone 15 of the syringe body 10 is filled with the process gas for the internal coating through a connection element 31 with a supply channel and a sealing element 22, and it is sucked out again at the opposite end, i.e. the plunger opening 12. To this end the plunger opening 12 is connected by a sealing element 25 to a tube 52, which extends through the antechamber 28 and is connected to a first evacuation instrument "Vacuum 1". In order to suppress entry of the electromagnetic fields into the tube, a separate shield 32 is arranged in the tube.

The gas delivery and discharge for the process gas for an external treatment, introduced into the surroundings of the syringe in the reactor space, and the delivery of electromagnetic energy through a vacuum-tight window 40 which is transparent for RF, HF or microwaves, correspond here to the example shown in FIG. 5.

FIG. 8 shows a variant of a through-flow reactor similar to the examples shown in FIG. 1 or 3. Process gas flows in the axial direction through cavity 13 of the syringe body 10 between the Luer cone 15 and the plunger opening 12, as in the examples shown in FIG. 1 or 3. Instead of injecting the electromagnetic energy through coaxial cables or waveguides as in the example shown in FIG. 8, however, an electromagnetic field is generated between two electrodes 56, 58 which are connected to a high-frequency generator 54. One or more other tuning elements 60 may be provided in addition. The reactor chamber may, as in this example, be formed by the cavity 13 of the syringe body 10 itself.

FIG. 9 shows a variant of the arrangement shown in FIG. 8 which is adapted for external coating of workpieces, such as the syringe body 10 depicted. This variant is also designed as a through-flow reactor, the process gas being introduced into the treatment zone on one side of the reactor chamber 2 through two or more supply channels 38 with gas distributors 39 connected thereto, and it is sucked out again through openings arranged in the opposite separating plate between the reactor chamber 2 and the antechamber 28. The side walls of the reactor chamber are formed by a dielectric tube 36, or may alternatively comprise dielectric wall elements, so that the high-frequency field radiated by the electrodes 56, 58 can penetrate through the reactor space 2. The cavity 13 of the syringe is sealed by sealing elements 42, 44 and may be kept at atmospheric pressure while the treatment zone, i.e. the regions of the reactor chamber 2 which enclose the syringe body 10, is evacuated.

FIGS. 10a and 10b show two variants of reverse flow reactors. The reactor shown in FIG. 10a is similar in structure to the through-flow reactor shown in FIG. 1. In contrast to the example shown in FIG. 1, however, the process gas is not introduced into the cavity 13 through the Luer cone 15. Rather, the Luer cone is sealed off from the rest of the reactor chamber 2 by a sealing element in this example. The delivery of process gas takes place through a cannula 64 here, which penetrates through the plunger opening 12 into the cavity 13. The cannula protrudes into the syringe body by at least $3/4$, preferably $9/10$, particularly preferably $95/100$ of the longitudinal extent of the cavity 13.

Regions of the cavity 13 are also locally shielded at least partially against the injected electromagnetic energy by means of a metal shield enclosing the base of the syringe body with the plunger opening. This prevents a particularly hot-burning plasma, which may damage the syringe body 10, from being able to form locally at this position. This measure may of course also be used in the other embodiments represented in the figures.

The example shown in FIG. 10b represents a reactor which is adapted for internal and external coating of syringe bodies 10. The reactor resembles the example shown in FIG. 7 in its structure, the process gas for the internal treatment being delivered through a cannula 64 protruding into the cavity 13 in the example shown in FIG. 10b.

FIG. 15 shows details of a reactor with delivery of electromagnetic energy through a coaxial cable. The outer conductor is not represented for the sake of simplicity. The inner conductor 20 comprises an axially extending channel 70, through which process gas can be introduced via the opening 16 into the cavity or interior 13 of the syringe body 10. In order to establish a hermetic connection to the opening 16 of the Luer cone 15, an internal sealing element 72 sealing the channel 70 is provided. This, like the other sealing elements, is preferably made of flexible material, in particular elastomer material such as silicone rubber, bromobutyl elastomer or polyisoprene-bromobutyl elastomer.

Such a coaxial cable may then be used for example for the reactor represented in FIG. 1. The treatment zone may nevertheless also be evacuable through the coaxial cable, in which case the axially extending channel 70 will be connected to an evacuation instrument.

In this example, the syringe body 10 also comprises a further cavity 80 which is formed between an edge 82 encircling the cover element 14 of the syringe body and the Luer cone 15. This cavity can be pumped out only with difficulty. An undesirable plasma may therefore also be formed in this cavity 80 when electromagnetic waves are injected for the plasma coating. In order to avoid this, the inner conductor 20 comprises an integrated filler body 84 which is inserted into the cavity 80 when fitting the inner conductor 20 and fixing the syringe body 10, and at least partially fills it. The filler body 84 may for example be made of a dielectric material such as plastic, or polymers, or ceramic or even metallic material, in order to absorb or reflect high-frequency electromagnetic energy and thus prevent ignition of a plasma in the immediate vicinity of the filled zone. The filler body 84 makes the temperature distribution on the workpiece more uniform during and after the plasma treatment, compared with a plasma treatment without such a filler body.

The inner conductor 20 furthermore comprises another collar 86, which encloses the cylinder 11 of the syringe body 10 along a part of its axial length. This collar acts as shielding, in order to shield regions of the cavity of the workpiece locally against injected electromagnetic energy. This prevents too hot a plasma from burning in the narrow Luer cone 15, which may damage the workpiece.

Figure 12:
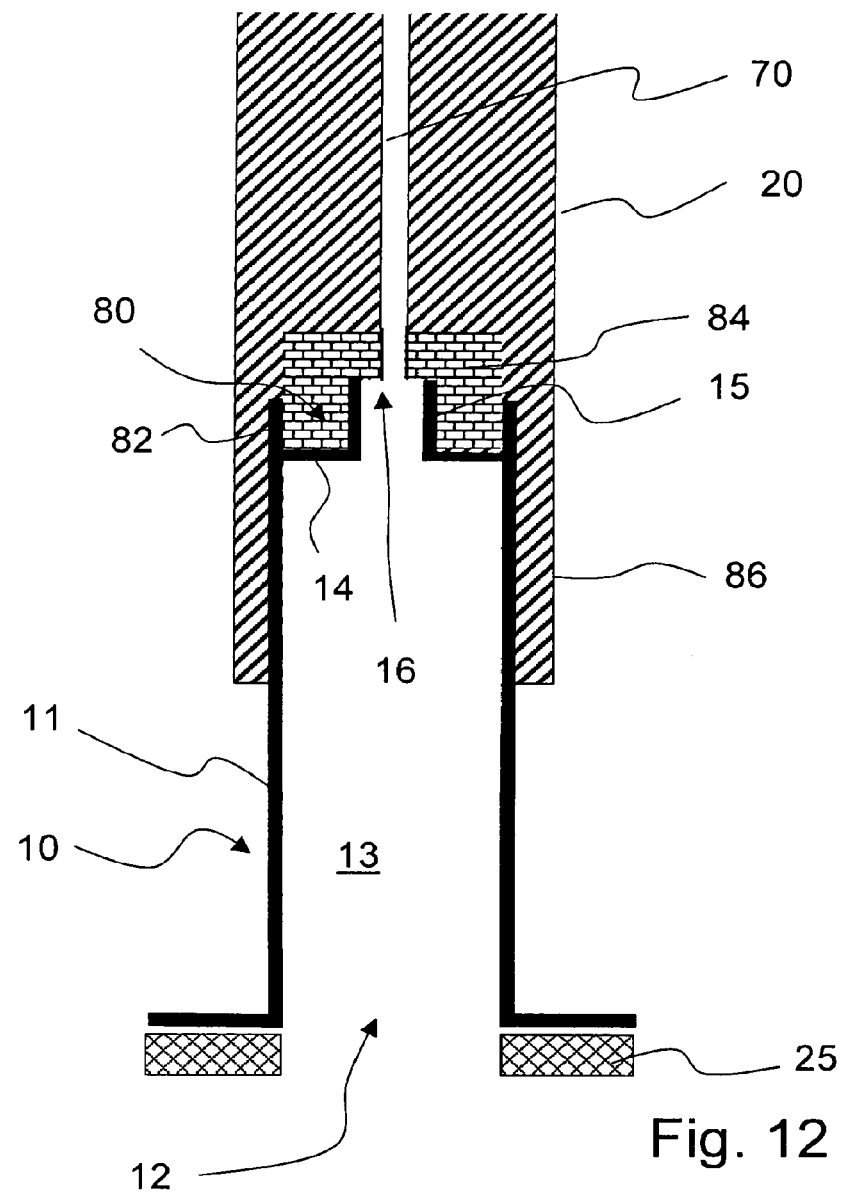

In the variant represented in FIG. 12, the filler body 84 simultaneously forms a sealing element for sealing off the cavity 13 and hermetically connecting to the channel 70. The filler body 84 is preferably made of elastomer material in this case, in particular silicone rubber, bromobutyl elastomer or polyisoprene-bromobutyl elastomer.

Figure 11:
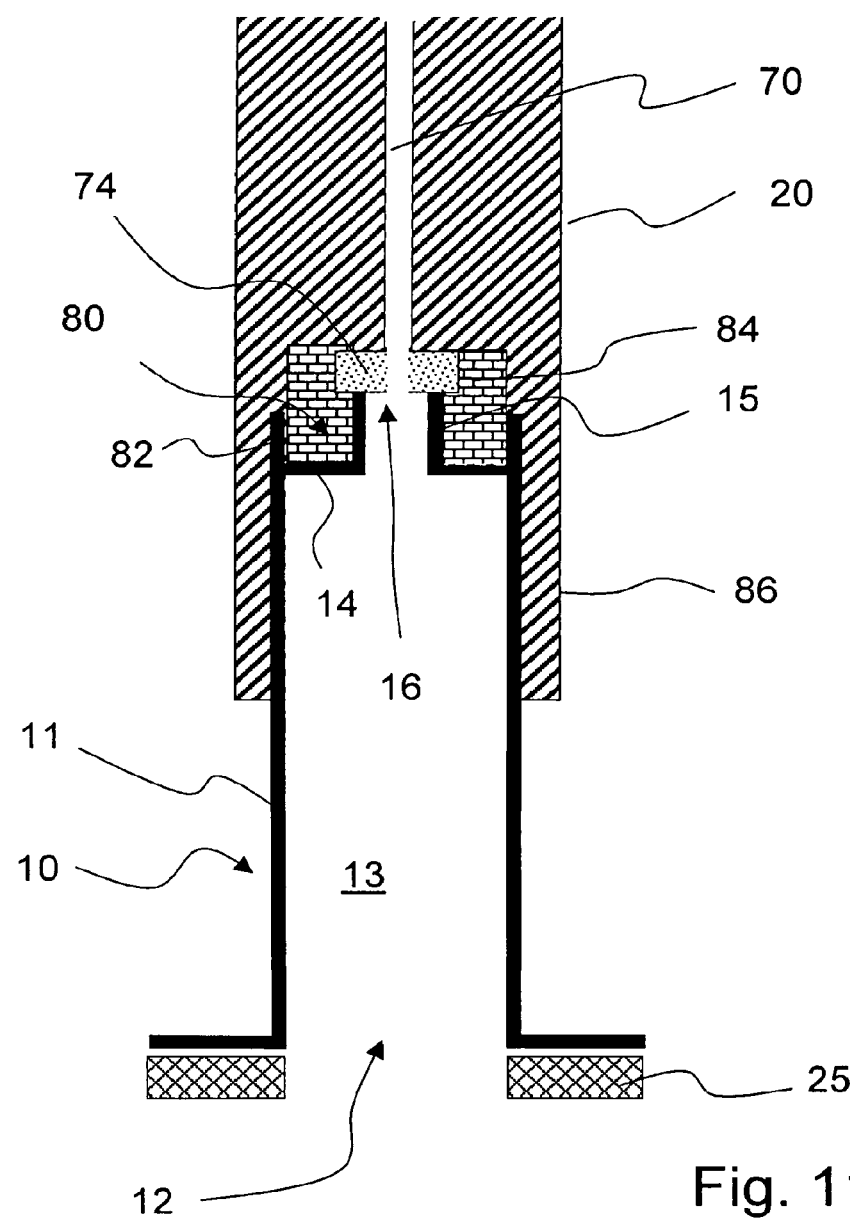
Figure 13:
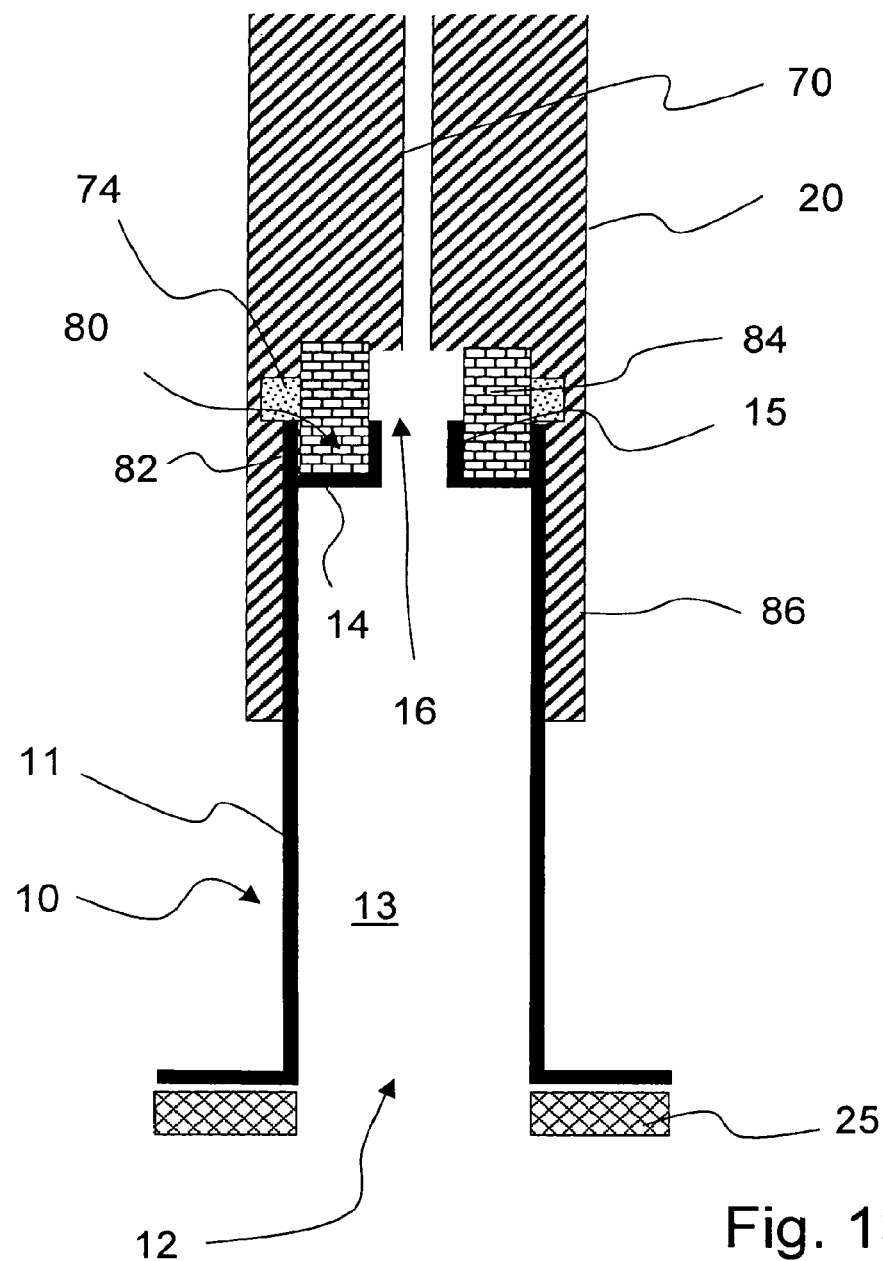

In the further variant shown in FIG. 13, a separate sealing element 74 is provided similarly as in the example represented in FIG. 11. In contrast to the example represented in FIG. 11, however, the annular sealing element 74 is in this case placed not on the Luer cone 15 but on the circumferential edge 82.

The filler body 84 is not a separate part in the variant shown in FIG. 14, rather it is formed by a section of the inner conductor material itself.

FIG. 15 shows an exemplary embodiment of the coating with a reverse flow reactor, such as is represented for example in FIG. 10a. The cannula for delivering the process gas is not represented in this example for the sake of simplicity.

The inner conductor comprises a cavity 88, which is formed by a collar 86 as in the previous examples. The syringe body 10 is inserted with the Luer cone 15 into the cavity, so that the collar 86 partially encloses the cylinder 11 and partially shields the region of the cavity 13 in the Luer cone 15. The opening 16 in the Luer cone 15 is sealed by a sealing element 44 as in the example shown in FIG. 10a. Filling of the cavity 80 may be obviated in this example, since the environment of the syringe body 10 remains at atmospheric pressure and it is evacuated only internally.

FIG. 16 shows an exemplary embodiment of a device according to the invention designed as a multilocation coating system. A multilocation coating system, such as is represented as an example in FIG. 16, may be adapted for simultaneously coating a plurality of workpieces. The example shown in FIG. 16 comprises in particular four reactors 100, although two or more reactors may for example also be used. The reactors are preferably designed as through-flow reactors. The system comprises a supply source 100 with a control instrument for providing a fluid or fluid mixture, preferably of two different fluids, or process gas mixtures. In this way, for example, an adhesion promoter coating and a barrier coating may sequentially be deposited by means of plasma coating. The gases or gas mixtures provided by the supply source 110 may be introduced separately into the reactors 100 through the valves 112 on the reactors. In order to provide the fluid mixtures, the supply instrument comprises a plurality of gas containers 95 which are connected by mass flow regulators 97 to two control valves 99. The reactors 100 with the coating locations respectively comprise separate energy sources 101. This prevents cross-contamination during the simultaneous coating. A separate antechamber 28 with an ignition instrument (not shown) is furthermore provided for each reactor 100. The ignition instrument is preferably an ignition electrode as represented in FIG. 1. The ignition instruments are in turn likewise equipped with respectively separate energy sources for exciting the glow discharge in the respective antechambers. This also prevents cross-contamination between the reactors. The antechambers 28, and therefore also the reactors 100, are connected together through a further chamber 105 to a vacuum generation instrument, which reduces the equipment outlay without causing cross-contamination during simultaneous coating. A regulating instrument 92 regulates the pump power of the instrument 90. In order to monitor the evacuation and the process gas decrease, pressure meters 93 are provided in the common chamber 105 and in the feed line to the vacuum generation instrument 90.

The invention will be further explained below with the aid of exemplary embodiments of coating methods.

In the exemplary embodiments presented below, a glow discharge, which does not yet lead to layer deposition on the substrate, is initially ignited in a subspace. Only by injecting high-frequency energy into the coating chamber is the plasma ignited in the coating reactor by means of this glow discharge. In said examples, a current in the range of 5 mA-50 mA and a frequency in the range of 10-25 kHz are used for the glow discharge. The glow discharge is current-regulated. The high voltage used lies between 0.5-2 kV.

Exemplary Embodiment 1a

PECVD Method, Internal Coating with Through-Flow Reactor

A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side. The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane (HMDSO) with an HMDSO flow rate of 3.4 sccm and an oxygen flow rate of 16.6 sccm at a pressure of 0.55 mbar is introduced through the side with the narrow cross section, i.e. at the Luer cone of the syringe. In this through-flow operation, a continuous flow is set up in which the gas flows parallel to the symmetry axis from the narrow cross section to the wide cross section. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated internally with a first adhesion promoter layer for a first coating time of 1.0 and with an average layer thickness of 40 nm. Toward the end of the first coating, the microwave energy is turned off. This is followed by a gas change phase, during which a second gas mixture of hexamethyldisiloxane (HMDSO) and oxygen with an HMDSO flow rate of 0.2 sccm and an oxygen flow rate of 39.8 sccm at a pressure of 0.8 mbar is fed into the interior of the syringe.

As soon as pulsed microwave energy is introduced into the reactor space from the microwave source with a frequency of 2.45 GHz and with an average microwave power of 30.8 W through the waveguide, a plasma is ignited internally in the syringe and a second inorganic barrier layer is applied for a second coating time of 55.4 s and with an average layer thickness of 30 nm. Toward the end of the coating process, the microwave energy is turned off and the supply of process gas is terminated. In a cooling phase, the coating is terminated and the syringe is cooled to room temperature. After re-evacuation, a $3^{rd}$ inorganic barrier layer is subsequently applied with the same process parameters and the same average layer thickness of 30 nm, so that the total average barrier thickness is 60 nm. Toward the end of the process, the interior of the syringe is flushed to atmospheric pressure.

The coated syringes exhibit an oxygen permeation of 0.0018 cm³/(Pckg d 0.21 bar) at 23° C. and 50% rel. humidity, while uncoated syringes have an oxygen permeation of 0.0074 cm³/(Pckg d 0.21 bar), so that the barrier improvement for oxygen is better than a factor of 4.

Exemplary Embodiment 1b

Through-Flow Reactor, Coating of the Luer Cone

A 1 ml COC syringe is coated internally in the through-flow reactor similarly as in Example 1a.
Step 1:
A first gas mixture of oxygen and hexamethyldisiloxane with an HMDSO flow rate of 3.4 sccm and an oxygen flow rate of 16.6 sccm at a pressure of 0.55 mbar is introduced at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure. During the process, the syringe is coated internally with a first adhesion promoter layer for a first coating time of 0.9 s. Toward the end of the first coating, the microwave energy is turned off.
Step 2:
This is followed by a gas change phase, during which a second gas mixture of hexamethyldisiloxane (HMDSO) and oxygen with an HMDSO flow rate of 0.6 sccm and an oxygen flow rate of 39.4 sccm at a pressure of 0.15 mbar is fed into the interior of the syringe. As soon as pulsed microwave energy is introduced into the reactor space from the microwave source with a frequency of 2.45 GHz and with an average microwave power of 30.8 W through the waveguide, a plasma is ignited internally in the syringe and a second inorganic barrier layer is applied for a second coating time of 47 s.

Toward the end of the coating process, the microwave energy is turned off and the supply of process gas is terminated. In a cooling phase, the syringe body is flushed internally with nitrogen and subsequently re-evacuated. Step 2 is subsequently repeated while maintaining the same coating time. Toward the end of the process, the interior of the syringe is flushed to atmospheric pressure.

By means of secondary ion mass spectrometry (SIMS) depth profiling, the syringe body coated in this way was examined at 3 positions. To this end, FIGS. 17 to 19 show the SIMS intensity-sputter time profiles at three different positions of the coated syringe body. FIG. 17 shows such a profile in the region of the large-diameter opening ("Position 15 mm"), FIG. 18 shows such a profile in the region of the middle of the syringe cylinder ("Position 40 mm") and FIG. 19 shows such a profile in the narrow channel of the Luer cone of the syringe ("Position 59 mm"). The profiles for the elements/compounds C, Si, O₂ and the C8 chain are represented. The junction of the layer system with the substrate can be seen with the aid of the intensity drop in the Si and O sputter time profiles. The different shapes for the C and C8 sputter time profiles are due to the adhesion promoter layer containing carbon.

Based on the data of the depth profilings as represented in FIGS. 17 to 19, the relative local layer thickness of the overall system is determined. To this end the sputter time τ in which the Si or O SIMS-sputter time profiles in the layer have fallen to half intensity is determined. The relative, normalized layer thickness $d_{rel}$ is given by the ratio of the times $\tau_1$ and $\tau_{ref}$ which are found:

$$d_{rel} = D_1/D_{ref} = \tau_1/\tau_{ref},$$

where $D_1$ and $D_{ref}$ correspond to the absolute local layer thicknesses. The "Position 40 mm" was selected as a reference position in this case.

The following are obtained as relative thicknesses:

| Position | Relative thickness $d_{rel}$ (%) |
|---|---|
| 15 mm (opening) | 60 |
| 40 mm (middle) | 100 |
| 59 mm (Luer cone) | 93 |

In particular, these analyses reveal that the narrow Luer channel of the syringe can be coated internally and that a very good layer uniformity is achieved in the through-flow reactor: the thickness difference between the Luer cone (59 mm) and the middle of the cylinder (40 mm) is only 93%/100%.

Exemplary Embodiment 1c

PECVD Method, Internal Coating with Through-Flow Reactor, Multiple Alternating Layers i) Layer System I:
A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side.
Step 1) The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.55 mbar is introduced through the side with the narrow cross section, i.e. at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average microwave power of 57 watts through the waveguide, while no plasma is ignited externally owing to the atmospheric pressure.

During the process, the syringe is coated externally with a first adhesion promoter layer with an average layer thickness of 40 nm. Toward the end of the first coating, the microwave energy is turned off.

Step 2:

This is followed by a gas change phase, during which a second gas mixture of hexamethyldisiloxane (HMDSO) and oxygen with an HMDSO flow rate of 0.6 sccm and an oxygen flow rate of 39.4 sccm at a pressure of 0.15 mbar is fed into the interior of the syringe.

As soon as pulsed microwave energy is introduced into the reactor space from the microwave source with a frequency of 2.45 GHz and with an average microwave power of 30.8 W through the waveguide, a plasma is ignited internally in the syringe and a second inorganic barrier layer is applied with an average layer thickness of 100 nm. Toward the end of the coating process, the microwave energy is turned off and the supply of process gas is terminated.

The 2-layer system produced as described above (40 m/100 nm) exhibits the following properties:

The coated syringes exhibit an oxygen permeation of 0.0004 cm$^3$/(Pckg d 0.21 bar) at 23° C. and 50% rel. humidity, while uncoated syringes have an oxygen permeation of 0.0074 cm$^3$/(Pckg d 0.21 bar), so that the barrier improvement for oxygen is a factor of 20.

Measurements of the water vapor permeation at 38° C., 90% relative humidity, reveal that the coated syringes have a water vapor permeation of 0.05 mg/(Pckg. d), while uncoated syringes have a water vapor permeation of 0.11 mg/(Pckg. d), so that the barrier improvement for water vapor is a factor of 2.

ii) Layer System II, 6-Level Multilayer (40 nm/100 nm/40 nm/100 nm/40 nm/100 nm):

The layers are applied similarly as for layer system I, although steps 1) and 2) are repeated a further two times so that an alternating layer system of 3 organic and 3 inorganic layers is applied overall.

The coated syringes exhibit an oxygen permeation of 0.00011 cm$^3$/(Pckg d 0.21 bar) at 23° C. and 50% rel. humidity, while uncoated syringes have an oxygen permeation of 0.0074 cm$^3$/(Pckg d 0.21 bar), so that the barrier improvement for oxygen is a factor of 70. Consequently, the oxygen barrier is improved substantially more highly by the multilayer coating with 6 layers of layer system II other than with layer system I, which consists of 2 layers.

Measurements of the water vapor permeation at 38° C., 90% relative humidity, reveal that the coated syringes have a water vapor permeation of 0.041 mg/(Pckg. d). Conversely, uncoated syringes have a water vapor permeation of 0.11 mg/(Pckg. d) so that the barrier improvement for water vapor is a factor of 2.7.

Exemplary Embodiment 1d

PECVD Method, Internal Coating with Through-Flow Reactor, Low Flow Rate, Higher Water Vapor Barrier A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side.

Step 1: The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.55 mbar is introduced through the side with the narrow cross section, i.e. at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure. During the process, the syringe is coated externally with a first adhesion promoter layer with an average layer thickness of 40 nm. Toward the end of the first coating, the microwave energy is turned off.

Step 2:

This is followed by a gas change phase, during which a second gas mixture of hexamethyldisiloxane (HMDSO) and oxygen with an HMDSO flow rate of 0.3 sccm and an oxygen flow rate of 19.7 sccm at a pressure of 0.15 mbar is fed into the interior of the syringe.

As soon as pulsed microwave energy is introduced into the reactor space from the microwave source with a frequency of 2.45 GHz and with an average microwave power of 30.8 W through the waveguide, a plasma is ignited internally in the syringe and a second inorganic-barrier layer is applied with an average layer thickness of 100 nm for a second coating time of 245.4 s. Toward the end of the coating process, the microwave energy is turned off and the supply of process gas is terminated.

Step 3:

A third gas mixture of oxygen and hexamethyldisiloxane with an HMDSO flow rate of 14 sccm and an oxygen flow rate of 6 sccm at a pressure of 0.55 mbar is introduced. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated internally with a third organosilicon layer with an average layer thickness of 100 nm. Toward the end of the first coating, the microwave energy is turned off.

The coated syringes exhibit an oxygen permeation of 0.0016 cm$^3$/(Pckg d 0.21 bar) at 23° C. and 50% rel. humidity, while uncoated syringes have an oxygen permeation of 0.0074 cm$^3$/(Pckg d 0.21 bar), so that the barrier improvement for oxygen is a factor of 4.8.

Measurements of the water vapor permeation at 38° C., 90% relative humidity, reveal that the coated syringes have a water vapor permeation of 0.02 mg/(Pckg. d). Conversely, uncoated syringes have a water vapor permeation of 0.11 mg/(Pckg. d) so that the barrier improvement for water vapor is a factor of 5.5.

As a further reference, syringes were coated just as in this exemplary embodiment but the second inorganic barrier layer is deposited with a total flow rate of 40 sccm in Step 2 while maintaining the same HMDSO concentration and while maintaining the layer thickness. At 38° C., 90% relative humidity, the water vapor permeation of this layer is 0.05 mg/(Pckg. d). The water vapor barrier is therefore significantly inferior than in the case of the barrier coating with the smaller total flow rate of 20 sccm in the second process step.

Exemplary Embodiment 1e

PECVD Method, Production of a Tetramethyldisiloxane (TMDSO) Barrier, Adhesion Promoter and a Third Layer by Means of Hexamethyldisiloxane (HMDSO)

A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side.

Step 1: The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.55 mbar is introduced through the side with the narrow cross section, i.e. at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated externally with a first adhesion promoter layer with an average layer thickness of 40 nm. Toward the end of the first coating, the microwave energy is turned off.

Step 2:

This is followed by a gas change phase, during which a second gas mixture of tetramethyldisiloxane (TMDSO) and oxygen with a TMDSO flow rate of 0.6 sccm and an oxygen flow rate of 39.4 sccm at a pressure of 0.15 mbar is fed into the interior of the syringe.

As soon as pulsed microwave energy is introduced into the reactor space from the microwave source with a frequency of 2.45 GHz and with an average microwave power of 30.8 W through the waveguide, a plasma is ignited internally in the syringe and a second inorganic barrier layer is applied with an average layer thickness of 100 nm for a second coating time of 133.7 s. Toward the end of the coating process, the microwave energy is turned off and the supply of process gas is terminated.

Step 3:

A third gas mixture of oxygen and hexamethyldisiloxane with an HMDSO flow rate of 14 sccm and an oxygen flow rate of 6 sccm at a pressure of 0.55 mbar is introduced. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure. During the process, the syringe is coated internally with a third organosilicon layer with an average layer thickness of 100 nm. Toward the end of the first coating, the microwave energy is turned off.

The coated syringes exhibit an oxygen permeation of 0.0017 cm$^3$/(Pckg d 0.21 bar) at 23° C. and 500 rel. humidity, while uncoated syringes have an oxygen permeation of 0.0074 cm$^3$/(Pckg d 0.21 bar), so that the barrier improvement for oxygen is a factor of 4.5. At 38° C., 90% relative humidity, the coated syringes exhibit a water vapor permeation of 0.03 mg/(Pckg. d), while uncoated syringes have a water vapor permeation of 0.11 mg/(Pckg. d) so that the barrier improvement for water vapor is a factor of 3.4.

Exemplary Embodiment 1f

PECVD Method, Production of all Layers from Tetramethyldisiloxane (TMDSO), Barrier Process with Shorter Process Time A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side.

Step 1: The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and tetramethyldisiloxane with a TMDSO flow rate of 3.4 sccm and an oxygen flow rate of 16.6 sccm at a pressure of 0.55 mbar is introduced through the side with the narrow cross section, i.e. at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated externally with a first adhesion promoter layer with an average layer thickness of 40 nm within a coating time of 0.8 s. Toward the end of the first coating, the microwave energy is turned off.

Step 2:

This is followed by a gas change phase, during which a second gas mixture of tetramethyldisiloxane (TMDSO) and oxygen with a TMDSO flow rate of 1.6 sccm and an oxygen flow rate of 78.4 sccm at a pressure of 0.15 mbar is fed into the interior of the syringe.

As soon as pulsed microwave energy is introduced into the reactor space from the microwave source with a frequency of 2.45 GHz and with an average microwave power of 59.3 W through the waveguide, a plasma is ignited internally in the syringe and a second inorganic barrier layer is applied with an average layer thickness of 100 nm for a second coating time of 36.7 s. Toward the end of the coating process, the microwave energy is turned off and the supply of process gas is terminated.

Step 3:

A third gas mixture of oxygen and tetramethyldisiloxane with a TMDSO flow rate of 14 sccm and an oxygen flow rate of 6 sccm at a pressure of 0.55 mbar is introduced. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated internally with a third organosilicon with an average layer thickness of 100 nm. Toward the end of the first coating, the microwave energy is turned off.

The coated syringes exhibit an oxygen permeation of 0.0015 cm$^3$/(Pckg d 0.21 bar) at 23° C. and 50% rel. humidity, while uncoated syringes have an oxygen permeation of 0.0074 cm$^3$/(Pckg d 0.21 bar), so that the barrier improvement for oxygen is a factor>5.

Exemplary Embodiment 2

Through-Flow Reactor, Internal Coating with Lower Average Power

A syringe is coated internally in the through-flow reactor similarly as in Example 1. The same adhesion promoter layer is applied. On the other hand, however, a second barrier layer is subsequently deposited with a much lower microwave power:

After having applied the 40 nm thick adhesion promoter layer, a second gas mixture of hexamethyldisiloxane and oxygen with an HMDSO flow rate of 0.2 sccm and an oxygen flow rate of 9.8 sccm at a pressure of 0.15 is fed into the interior of the syringe in a gas change phase.

As soon as pulsed microwave energy is introduced into the reactor space from the microwave source with a frequency of 2.45 GHz and with an average microwave power of 15.7 W through the waveguide, a plasma is ignited internally in the syringe and a second inorganic barrier layer is applied for a second coating time of 138.9 s and with an average layer thickness of 60 nm. Toward the end of the coating process, the microwave energy is turned off, the supply of process gas is terminated and the interior of the syringe is flushed to atmospheric pressure.

The coated syringes exhibit an oxygen permeation of 0.0020 cm$^3$/(Pckg d 0.21 bar) at 23° C. and 50% rel. humidity, while uncoated syringes have an oxygen permeation of 0.0074 cm$^3$/(Pckg d 0.21 bar), so that the barrier improvement for oxygen is better than a factor of 3.5.

Exemplary Embodiment 3

Through-Flow Reactor, Barrier Coating of a Glass Syringe

A Fiolax glass syringe, 1 ml volume, is introduced into the reactor described in FIG. 2 with the large cross section upward and the narrow cross section (Luer cone) downward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side. The interior of the syringe is subsequently evacuated until a base pressure<0.05 mbar is reached. The exterior remains at atmospheric pressure throughout the treatment process.

While the connection to the vacuum at the lower side is maintained, the gas inlet valve is opened and a first gas of oxygen with an oxygen flow rate of 40 sccm at a pressure of 2.5 mbar is introduced through the side with the narrow cross section, i.e. at the Luer cone of the syringe. In this through-flow operation, a continuous flow is set up in which the gas flows parallel to the symmetry axis from the narrow cross section to the wide cross section.

A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 167 watts through the waveguide, while no plasma is ignited externally owing to the atmospheric pressure. During the process, the syringe is heated internally to a temperature of 250° C. for a treatment time of 19 s.

Toward the end of the heating process, the microwave energy is turned off. This is followed by a gas change phase, during which a second gas mixture of hexamethyldisiloxane and oxygen with an HMDSO flow rate of 1.2 sccm and an oxygen flow rate of 40 sccm at a pressure of 2.5 mbar is fed into the interior of the syringe. Before the start of the coating, the syringe is at a temperature of 205° C.

As soon as pulsed microwave energy is introduced into the reactor space from the microwave source with a frequency of 2.45 GHz and with an average microwave power of 167 W through the waveguide, a plasma is ignited internally in the syringe and a second inorganic barrier layer is applied for a coating time of 13 s and with an average layer thickness of 100 nm. Toward the end of the coating process, the microwave energy is turned off and the supply of process gas is terminated. Toward the end of the process, the interior of the syringe is flushed to atmospheric pressure.

The coated syringes are filled with 0.1 mol HCl and autoclaved at 121° C. for 6 hours. After the autoclaving, the sodium leaching is measured. Compared with uncoated glass syringes, the sodium leaching is reduced significantly and is less than 0.3 ppm.

Exemplary Embodiment 4a

Reverse Flow Reactor Syringe Coating

A syringe body made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 10a with the large cross section downward and the narrow cross section (Luer cone) upward. The syringe initially rests on the sealing surface on the lower side of the reactor and a gas feed (supply channel) consisting of stainless steel, with an outer diameter of 2 mm, an inner diameter of 1.5 mm, projects into the syringe with a penetration depth of 34.5 mm. The syringe is hermetically closed with sealing material on the side with the narrow cross section (Luer cone). The upper side of the reactor is subsequently lowered, and a mechanical counterpressure ensures that the syringe rests hermetically on the lower side. The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.4 mbar is introduced through the gas feed. A continuous flow is thereby set up. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 W through the waveguide, while no plasma is ignited externally owing to the atmospheric pressure. During the process, the syringe is coated internally with a first adhesion promoter layer for a first coating time of 1.2 s and with an average layer thickness of 40 nm. Toward the end of the first coating, the microwave energy is turned off. This is followed by a gas change phase, during which a second gas mixture of hexamethyldisiloxane and oxygen with an HMDSO flow rate of 0.44 sccm and an oxygen flow rate of 39.6 sccm at a pressure of 0.4 mbar is fed into the interior of the syringe. As soon as pulsed microwave energy is introduced into the reactor space from the microwave source with a frequency of 2.45 GHz and with an average microwave power of 84.9 W through the waveguide, a plasma is ignited internally in the syringe and a second inorganic-barrier layer is applied for a second coating time of 15.3 s and with an average layer thickness of 20 nm. Toward the end of the coating process, the microwave energy is turned off and the supply of process gas is terminated. The substrate is subsequently cooled in a cooling phase, and the coating process for the barrier layer is repeated three times after evacuation, the same process parameters being used and equally thick barrier layers being deposited as in Step 2. The overall barrier thickness of the 3 successively applied barrier layers 60 nm. Toward the end of the process, the interior of the syringe is flushed to atmospheric pressure.

The coated syringes exhibit an oxygen permeation of 0.0033 $cm^3$/(Pckg d 0.21 bar) at 23° C. and 50% rel. humidity, while uncoated syringes have an oxygen permeation of 0.0074 $cm^3$/(Pckg d 0.21 bar), so that the barrier improvement for oxygen is better than a factor of 2.5.

Exemplary Embodiment 4b

Reverse Flow Reactor, Syringe Coating

A syringe body made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 10a with the large cross section downward and the narrow cross section (Luer cone) upward. The syringe initially rests on the sealing surface on the lower side of the reactor and a gas feed (supply channel) consisting of stainless steel, with an outer diameter of 2 mm, an inner diameter of 1.5 mm, projects into the syringe with a penetration depth of 17.5 mm. The syringe is hermetically closed with sealing material on the side with the narrow cross section (Luer cone). The upper side of the reactor is subsequently lowered, and a mechanical counterpressure ensures that the syringe rests hermetically on the lower side. The interior of the syringe is subsequently evacuated until a base pressure<0.05 mbar is reached. The exterior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.4 mbar is introduced through the gas feed. A continuous flow is thereby set up. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 W through the waveguide, while no plasma is ignited externally owing to the atmospheric pressure. During the process, the syringe is coated internally with a first adhesion promoter layer for a first coating time of 2.1 s and with an average layer thickness of 40 nm. Toward the end of the first coating, the microwave energy is turned off. This is followed by a gas change phase, during which a second gas mixture of hexamethyldisiloxane and oxygen with an HMDSO flow rate of 0.38 sccm and an oxygen flow rate of 24.6 sccm at a pressure of 0.4 mbar is fed into the interior of the syringe. As soon as pulsed microwave energy is introduced into the reactor space from the microwave source with a frequency of 2.45 GHz and with an average microwave power of 214 W through the waveguide, a plasma is ignited internally in the syringe and a second inorganic barrier layer is applied for a second coating time of 3 s and with an average layer thickness of 6.4 nm. Toward the end of the coating process, the microwave energy is turned off and the supply of process gas is terminated. The substrate is subsequently cooled in a cooling phase, and the coating process for the barrier layer is repeated ten times after evacuation, the same process parameters being used and equally thick barrier layers being deposited as in Step 2. The overall barrier thickness of the 11 successively applied barrier layers is 70 nm. Toward the end of the process, the interior of the syringe is flushed to atmospheric pressure.

The coated syringes exhibit an oxygen permeation of 0.0012 $cm^3$/(Pckg d 0.21 bar) at 23° C. and 50% rel. humidity, while uncoated syringes have an oxygen permeation of 0.0074 $cm^3$/(Pckg d 0.21 bar), so that the barrier improvement for oxygen is better than a factor of 6.

Exemplary Embodiment 5

Reverse Flow Reactor, Coating of Vials

A vial made of COC (cyclic olefinic copolymer), 12 ml volume, is put in the reactor described in FIG. 10a. The vial initially rests on the sealing surface on the lower side of the reactor and a gas feed made of metal projects into the vial. The upper side of the reactor is subsequently lowered, and the interior of the vial is subsequently evacuated until a base pressure<0.05 mbar is reached. The outer region of the reactor chamber, surrounding the vial, remains at atmospheric pressure throughout the treatment process.

While the connection to the vacuum at the lower side is maintained, the gas inlet valve is opened and a first gas mixture of oxygen and hexamethyldisiloxane with an HMDSO flow rate of 4.25 sccm and an oxygen flow rate of 20.75 sccm at a pressure of 0.4 mbar is introduced through the gas feed. A continuous flow is thereby set up, in which the gas is distributed axisymmetrically. A glow discharge is ignited in the subspace by means of the ignition device, although this does not yet lead to layer deposition on the inside of the vial. A plasma is not ignited in the interior of the vial until the time at which pulsed microwave energy is input into the reactor space from the microwave source with a frequency of 2.45 GHz and an average pulse power of 57 W through the waveguide, while no plasma is ignited externally owing to the atmospheric pressure.

During the process, the vial is coated internally with a first adhesion promoter layer for a first coating time of 0.4 s and with an average layer thickness of 20 nm. Toward the end of the first coating, the microwave energy is turned off. This is followed by a gas change phase, during which a second gas mixture of hexamethyldisiloxane and oxygen with an HMDSO flow rate of 0.75 sccm and an oxygen flow rate of 50 sccm at a pressure of 0.4 mbar is fed into the interior of the vial.

As soon as pulsed microwave energy is introduced into the reactor space from the microwave source with a frequency of 2.45 GHz and with an average microwave power of 214 W through the waveguide, a plasma is ignited internally in the vial and a second inorganic barrier layer is applied for a second coating time of 34 s and with a layer thickness of 100 nm. Toward the end of the coating process, the microwave energy is turned off, the supply of process gas is terminated and the interior of the vial is flushed to atmospheric pressure.

The coated vials exhibit an oxygen permeation of 0.001 $cm^3$/(Pckg d 0.21 bar) at 23° C. and 50% rel. humidity, while uncoated vials have an oxygen permeation of 0.0283 $cm^3$/(Pckg is d 0.21 bar). The resolution limit of the permeation measuring instrument is reached, so that the barrier improvement improved for oxygen is better than a factor of 28.

At 38° C., 90% relative humidity, coated vials exhibit a water vapor permeation of 0.16 mg/(Pckg. d), while uncoated vials have a water vapor permeation of 0.3 mg/(Pckg. d). The barrier improvement achieved for water vapor is therefore a factor of 1.9.

Storage Stability:

During a storage test, the vials were filled with i) distilled water and ii) 0.1 molar hydrochloric acid and stored for 1 week at 60° C. After emptying and drying, the oxygen permeation was again measured at 23° C. and 50% rel. humidity. After the storage test, in both cases i) and ii) the oxygen permeation was still at the resolution limit of 0.001 $cm^3$/(Pckg d 0.21 bar). An oxygen barrier improvement by a factor of more than 28 therefore still remains.

Exemplary Embodiment 6

Internal Coating of Syringe with Barrier Layer, Outer Coating with Scratch Protection Layer a) A COC syringe, 1 ml volume, is coated in a reactor corresponding to FIG. 7. The syringe is first coated internally with an adhesion promoter layer and a barrier layer using "Vacuum 1" and delivery of the process gas through "Gas 1" according to Exemplary Embodiment 1. After flushing the interior of the syringe to atmospheric pressure, the reactor exterior is evacuated through "Vacuum 2" to a base pressure<0.05 mbar. A mixture of hexamethyldisiloxane and oxygen is subsequently delivered into the exterior through the gas distributor device "Gas 2", while sustaining the continuous gas flow through "Vacuum 2". Pulsed microwave energy with a frequency of 2.45 GHz is subsequently input into the reactor space using the microwave source, and a plasma is now ignited in the exterior. A 100 nm thick scratch protection layer is applied on the outer wall of the substrate.

b) A COC syringe, 12 ml volume, is coated in a reactor corresponding to FIG. 10b. The syringe is first coated internally with an adhesion promoter layer and a barrier layer using "Vacuum 1" and delivery of process gas through "Gas 1" according to Exemplary Embodiment 4. After flushing the interior of the syringe to atmospheric pressure, the reactor exterior is evacuated through "Vacuum 2" to a base pressure<0.05 mbar. A mixture of hexamethyldisiloxane and oxygen is subsequently delivered into the exterior through the gas distributor device "Gas 2", while sustaining the continuous gas flow through "Vacuum 2".

Pulsed microwave energy with a frequency of 2.45 GHz is subsequently input into the reactor space using the microwave source, and a plasma is now ignited in the exterior. A 100 nm thick scratch protection layer is applied on the outer wall of the substrate.

Exemplary Embodiment 7a

Barrier Layer of Amorphous Carbon on Organosilicon Bonding Layer, Deposition on a COC Syringe A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side. The interior of the syringe is subsequently evacuated until a base pressure<0.05 mbar is reached. The exterior remains at atmospheric pressure throughout the treatment process.

Step 1: While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.55 mbar is introduced through the side with the narrow cross section, i.e. at the Luer cone of the syringe. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average pulse power of 57 watts through the waveguide, while no plasma is ignited externally owing to the atmospheric pressure.

During the process, the syringe is coated internally with a first organosilicon adhesion promoter layer with an average layer thickness of 40 nm. Toward the end of the first coating, the microwave energy is turned off.

Step 2: Next, acetylene gas at a pressure of 0.2 mbar and with a flow rate of 40 sccm is fed in during a gas change phase. A glow discharge is ignited in the subspace by means of the ignition device, although this does not yet lead to layer deposition on the inside of the syringe. A plasma is not ignited in the interior of the syringe until the time at which pulsed microwave energy is input into the reactor space from the microwave source with a frequency of 2.45 GHz and an average microwave power of 30.8 W through the waveguide, while no plasma is ignited externally owing to the atmospheric pressure. During the process, the syringe is coated internally with a barrier layer of amorphous carbon for a coating time of 10 s. Toward the end of the coating process, the microwave energy is turned off, the supply of process gas is terminated and the interior of the syringe is flushed to atmospheric pressure.

Compared with the uncoated substrate, a barrier improvement is achieved for oxygen:

The coated syringes exhibit an oxygen permeation of 0.007 cm$^3$/(Pckg d 0.21 bar) at 23° C. and 50% rel. humidity, while uncoated syringes have an oxygen permeation of 0.008 cm$^3$/(Pckg d 0.21 bar). The barrier improvement for oxygen is a factor of 1.2.

Exemplary Embodiment 7b

Barrier Layer of Amorphous Carbon on Organosilicon Bonding Layer, Deposition on COC Vials A vial made of COC (cyclic olefinic copolymer), 12 ml volume, is put in the reactor described in FIG. 10a. The vial initially rests on the sealing surface on the lower side of the reactor and a gas feed made of metal projects into the vial. The upper side of the reactor is subsequently lowered, and the interior of the vial is subsequently evacuated until a base pressure<0.05 mbar is reached. The outer region of the reactor chamber, surrounding the vial, remains at atmospheric pressure throughout the treatment process.

Step 1: While the connection to the vacuum at the lower side is maintained, the gas inlet valve is opened and a first gas mixture of oxygen and hexamethyldisiloxane with an HMDSO flow rate of 4.25 sccm and an oxygen flow rate of 20.75 sccm at a pressure of 0.4 mbar is introduced through the gas feed. A glow discharge is ignited in the antechamber by means of the ignition device, although this does not yet lead to layer deposition on the inside of the syringe. A plasma is not ignited in the interior of the vial until the time at which pulsed microwave energy is input into the reactor space from the microwave source with a frequency of 2.45 GHz and an average pulse power of 57 W through the waveguide, while no plasma is ignited externally owing to the atmospheric pressure.

During the process, the vial is coated internally with a first adhesion promoter layer for a first coating time of 0.5 and with a thickness of 20 nm. Toward the end of the first coating, the microwave energy is turned off.

Step 2: Next, acetylene gas at a pressure of 0.2 mbar and with a flow rate of 80 sccm is fed in during a gas change phase. A glow discharge is ignited in the subspace by means of the ignition device, although this does not yet lead to layer deposition on the inside of the vial. A plasma is not ignited in the interior of the vial until the time at which pulsed microwave energy is input into the reactor space from the microwave source with a frequency of 2.45 GHz and an average microwave power of 72.7 W through the waveguide, while no plasma is ignited externally owing to the atmospheric pressure. During the process, the vial is coated internally with a barrier layer of amorphous carbon for a coating time of 10 s. Toward the end of the coating process, the microwave energy is turned off, the supply of process gas is terminated and the interior of the vial is flushed to atmospheric pressure.

The coated vials exhibit an oxygen permeation of 0.0006 cm$^3$/(Pckg d 0.21 bar) at 23° C. and 50% rel. humidity, while uncoated vials have an oxygen permeation of 0.0283 cm$^3$/(Pckg d 0.21 bar), so that the barrier improvement achieved for oxygen is better than a factor of 40. This high barrier improvement could be detected by a high-resolution permeation measurement method in this case.

At 38° C., 90% relative humidity, coated vials exhibit a water vapor permeation of 0.23 mg/(Pckg. d), while uncoated vials have a water vapor permeation of 0.4 mg/(Pckg. d). The barrier improvement achieved for water vapor is therefore a factor of 1.8.

Exemplary Embodiment 7c

Barrier Layer of Amorphous Carbon on Organosilicon Bonding Layer, Deposition on COC Vials A vial made of COC (cyclic olefinic copolymer), 12 ml volume, is put in the reactor described in FIG. 10a. The vial initially rests on the sealing surface on the lower side of the reactor and a gas feed made of metal projects into the vial. The upper side of the reactor is subsequently lowered, and the interior of the vial is subsequently evacuated until a base pressure<0.05 mbar is reached. The outer region of the reactor chamber, surrounding the vial, remains at atmospheric pressure throughout the treatment process.

Step 1: Next, acetylene gas at a pressure of 0.2 mbar and with a flow rate of 50 sccm is fed in during a gas change phase. A glow discharge is ignited in the subspace by means of the ignition device, although this does not yet lead to layer deposition on the inside of the vial. A plasma is not ignited in the interior of the vial until the time at which pulsed microwave energy is input into the reactor space from the microwave source with a frequency of 2.45 GHz and an average microwave power of 214 W through the waveguide, while no plasma is ignited externally owing to the atmospheric pressure. During the process, the vial is coated internally with a barrier layer of amorphous carbon for a coating time of 30 s. Toward the end of the coating process, the microwave energy is turned off, the supply of process gas is terminated and the interior of the vial is flushed to atmospheric pressure.

The coated vials exhibit an oxygen permeation of 0.0008 cm$^3$/(Pckg d 0.21 bar) at 23° C. and 50% rel. humidity, while uncoated vials have an oxygen permeation of 0.0283 cm$^3$/(Pckg d 0.21 bar), so that the barrier improvement achieved for oxygen is better than a factor of 30. This high barrier improvement could be detected by a high-resolution permeation measurement method in this case.

At 38° C., 90% relative humidity, coated vials exhibit a water vapor permeation of 0.22 mg/(Pckg. d), while uncoated vials have a water vapor permeation of 0.4 mg/(Pckg. d). The barrier improvement achieved for water vapor is therefore a factor of 1.8.

Exemplary Embodiment 8

External Coating with Barrier Layer

A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 4 with the large cross section downward and the narrow cross section (Luer cone) upward. The syringe is sealed hermetically at both openings: the syringe initially rests on the sealing surface on the lower side of the reactor and is sealed from the vacuum at the bottom. On the upper side, the narrow cross section (Luer cone) is covered and is also vacuum-tight.

The exterior of the syringe is subsequently evacuated until a base pressure<0.05 mbar is reached. The interior remains at atmospheric pressure throughout the treatment process. While the connection to the vacuum at the lower side is maintained, the gas inlet valve is opened and a first gas mixture of oxygen and hexamethyldisiloxane with an HMDSO flow rate of 3.4 sccm and an oxygen flow rate of 16.6 sccm at a pressure of 0.55 mbar is introduced through the gas distributor device. In this through-flow operation, a continuous flow is set up in which the gas flows parallel to the symmetry axis. A glow discharge is ignited in the subspace by means of the ignition device, although this does not yet lead to layer deposition on the inside of the syringe. A plasma is not ignited in the exterior of the reactor until the time at which pulsed microwave energy is input into the reactor space from the microwave source with a frequency of 2.45 GHz and an average microwave power of 57 watts through the waveguide, while no plasma is ignited internally owing to the atmospheric pressure. During the process, the syringe is coated externally with a first adhesion promoter layer for a first coating time of 1.1 s and with a thickness of 40 nm. Toward the end of the first coating, the microwave energy is turned off. This is followed by a gas change phase, during which a second gas mixture of hexamethyldisiloxane and oxygen with an HMDSO flow rate of 0.8 sccm and an oxygen flow rate of 39.2 sccm at a pressure of 0.8 mbar is fed into the exterior of the reactor. As soon as pulsed microwave energy is introduced into the reactor space from the microwave source with a frequency of 2.45 GHz and with an average microwave power of 76.9 W through the waveguide, a plasma is ignited in the exterior and a second inorganic barrier layer is applied for a second coating time of 15.7 s and with a thickness of 15 nm. Toward the end of the coating process, the microwave energy is turned off and the supply of process gas is terminated. The substrate is subsequently cooled in a cooling phase, and the coating process for the barrier layer is repeated four times after evacuation, the same process parameters being used and equally thick barrier layer is being deposited as in Step 2. The overall barrier thickness of the four successively applied barrier layers is 60 nm. Toward the end of the process, the interior of the syringe is flushed to atmospheric pressure. Compared with the uncoated syringe, the coated syringe has a barrier improvement for oxygen.

Exemplary Embodiment 9

Internal Coating with Decorative Layer (Layer with Selective Reflection in the Visible Spectral Range)

A syringe made of COC (cyclic olefinic copolymer), 1 ml volume with a cylinder height of 54 mm and a cylinder inner diameter of 6.5 mm, a total height of 64.5 mm and a Luer cone according to DIN 594 with a length of 10 mm and with an internal opening diameter of 2 mm is put in the reactor described in FIG. 1 with the large cross section downward and the narrow cross section (Luer cone) upward. The syringe initially rests on the sealing surface on the lower side of the reactor. The upper side of the reactor is subsequently lowered, and the syringe is hermetically sealed on the upper side when the reactor is closed. The counterpressure ensures that the syringe also rests hermetically on the lower side. The interior of the syringe is subsequently evacuated until a base pressure<0.05 mbar is reached.

The exterior remains at atmospheric pressure throughout the treatment process.

Step 1: Deposition of a High Refractive Index Layer

While the connection to the vacuum at the lower side is maintained, the gas inlet valve is opened and a first gas mixture of titanium chloride and oxygen with a $TiCl_4$ flow rate of 0.2 sccm and an oxygen flow rate of 19.8 sccm at a pressure of 0.2 mbar is fed into the interior of the syringe through the side with the narrow cross section, i.e. at the Luer cone of the syringe. As soon as pulsed microwave energy is introduced into the reactor space from the microwave source with a frequency of 2.45 GHz and with an average microwave power of 90 W through the waveguide, a plasma is ignited internally in the syringe and a first high refractive index layer is applied for a first coating time of 27 s and with a thickness of 30 nm.

Step 2: Deposition of a Low Refractive Index Layer

This is followed by a gas change phase, during which a second gas mixture of hexamethyldisiloxane and oxygen with an HMDSO flow rate of 0.2 sccm and an oxygen flow rate of 9.8 sccm at a pressure of 0.15 mbar is fed into the interior of the syringe. As soon as pulsed microwave energy is introduced into the reactor space from the microwave source with a frequency of 2.45 GHz and with an average microwave power of 15.7 W through the waveguide, a plasma is ignited internally in the syringe and a second inorganic barrier layer is applied for a second coating time of 93 s with an average layer thickness of 40 nm.

Steps 1 and 2 are repeated 8 times, the layer thicknesses and the coating times being adapted for the layer design.

Toward the end of the coating process, the microwave energy is turned off, the supply of process gas is terminated and the interior of the syringe is flushed to atmospheric pressure.

A decorative effect is achieved by the alternating layer system of high and low refractive index layers: the layer reflects the incident light selectively (i.e. wavelength-dependently). The layer design is adapted so that the layer system has a bluish effect.

Furthermore, owing to the additional barrier effect of the titanium oxide layer, the barrier improvement for oxygen is significantly better than in Exemplary Embodiment 2.

Exemplary Embodiment 10

Mirroring

The layers are applied similarly as in Exemplary Embodiment 9. 12 layers are used, however, and the design is adapted so that the visible light spectrum is reflected selectively.

Exemplary Embodiment 11

Layer with Selective Reflection in the Infrared Wavelength Range

The layers are applied similarly as in Exemplary Embodiment 10. 14 layers are used, however, and the design is adapted so that light of the infrared wavelength range is reflected selectively.

Exemplary Embodiment 12

Layer with Selective Reflection in the Infrared Wavelength Range

The layers are applied similarly as in Exemplary Embodiment 10. 14 layers are used, however, and the design is adapted so that light of the infrared wavelength range is reflected selectively.

Exemplary Embodiment 13

External Coating with a UV Reflection Layer and Scratch Protection Layer

The UV reflection layer is a layer with selective reflection in the ultraviolet wavelength range.

The layers are deposited similarly as in Exemplary Embodiment 8, and the layer sequence is similar to Exemplary Embodiment 9. 16 layers are used, however, and the design is adapted so that light of the ultraviolet wavelength range is reflected selectively. A 100 nm thick scratch protection layer is additionally applied as a final layer, with a coating process similar to Exemplary Embodiment 6.

Exemplary Embodiment 14

External Coating with Decorative Layer

Similar to Exemplary Embodiment 9 and with the reactor corresponding to Exemplary Embodiment 8 and similarly to the method according to Exemplary Embodiment 9, a decorative layer is applied on the outside.

It is clear to the person skilled in the art that the invention is not restricted to the exemplary embodiments described above, rather it may be modified in a wide variety of ways. In particular, the features of the individual exemplary embodiments may also be combined with one another.

The invention claimed is:

1. A method for plasma treatment of a workpiece in the form of a hollow body, the method comprising:
    at least partially evacuating a treatment zone in a reactor chamber;
    introducing a process gas into the treatment zone;
    igniting a glow discharge in a space being separated from the reactor chamber and provided between the reactor chamber and a gas outlet, wherein the space in which the glow discharge is ignited is separated from the treatment zone by at least an electromagnetic shielding and is connected to an evacuation instrument, and wherein the glow discharge on its own does not yet ignite a plasma in the reactor chamber;
    exciting gas contained in the space by igniting the glow discharge and thereby providing excited species comprising at least one of ions, electrons and excited neutral particles, which excited species diffuse into the treatment zone; and
    igniting a plasma in the treatment zone by means of injected electromagnetic energy in the process gas introduced into the treatment zone;
    wherein the igniting of the plasma in the treatment zone by injecting the electromagnetic energy is facilitated due to free charge carriers; and
    wherein the process gas flows through the treatment zone between opposite ends of the zone during the plasma treatment into the space separated from the treatment zone.

2. The method as claimed in claim 1, wherein the plasma treatment is carried out exclusively on the inside of the hollow body.

3. The method as claimed in claim 1, wherein the plasma treatment is carried out exclusively on the outside of the hollow body.

4. The method as claimed in claim 1, wherein the plasma treatment is carried out both on the inside and on the outside of the hollow body, and wherein the plasma treatments on the inside and the outside of the hollow body are different or affect the surfaces in different ways.

5. The method as claimed in claim 1, wherein the workpiece:
    i) is shaped cylindrically or quasi-cylindrically and has a maximum external diameter of between 1 mm and 50 mm, or
    ii) has a maximum internal diameter of between 1 mm and 50 mm, and a wall thickness of from 0.2 mm to 10 mm, or
    iii) comprises a second cylindrical or quasi-cylindrical appendage with a smaller diameter and a shorter length, which has a narrow, cannula-like internal diameter of between 0.01 and 15 mm, or
    iv) has a volume in the range of 0.1-100 ml.

6. The method as claimed in claim 1, wherein the workpiece is shaped cylindrically or quasi-cylindrically with a first cylindrical or quasi-cylindrical surface and comprises a cylindrical or quasi-cylindrical appendage with a second cylindrical or quasi-cylindrical surface, at least one thin layer with a layer thickness D1 being applied on the first cylindrical or quasi-cylindrical surface and the layer being applied with a thickness D2 on the second quasi-cylindrical surface, the relation $0.2 \leq D2/D1 \leq 5$ being satisfied for the ratio of the thicknesses D1 and D2.

7. The method as claimed in claim 1, wherein the process gas is put into the treatment zone through at least one cannula, the internal opening diameter of which is between 0.1 and 5.0 mm, and the wall thickness of which is between 0.05 mm and 3.0 mm.

8. The method as claimed in claim 1, wherein the workpiece is evacuated through an opening at a first end and the process gas is introduced through another opening at a second end of the workpiece, which lies opposite the first end, and wherein electromagnetic energy is input in the axial direction.

9. The method as claimed in claim 1, wherein syringe bodies are plasma-treated internally.

10. The method as claimed in claim 9, wherein the cavity of the syringe is evacuated through its plunger opening.

11. The method as claimed in claim 9, wherein the process gas is delivered through the Luer cone of the syringe body.

12. The method as claimed in claim 9, wherein the process gas is delivered through the plunger opening of the syringe body.

13. The method as claimed in claim 1, wherein the plasma treatment comprises at least one of plasma coating, plasma activation, plasma pretreatment, plasma cleaning, plasma immersion, plasma modification, plasma sterilization.

14. The method as claimed in claim 1, wherein the plasma treatment is used to deposit at least one layer which
   i) has a barrier effect against gases, or
   ii) has a barrier effect against constituents from the workpiece, or wherein
   iii) a barrier layer with a chemical barrier effect, or
   iv) a scratch protection layer is deposited, or
   v) a UV-reflecting or UV-absorbing layer is deposited, or
   vi) a coloring layer is deposited, or
   vii) a mirroring or blooming layer is deposited.

15. The method as claimed in claim 1, wherein a plastic surface of the workpiece, which contains at least one of the following materials, is treated:
   polycyclic hydrocarbons, polyethylene terephthalate (PET) or PETG, polystyrene, polyethylene, polypropylene and oriented polypropylene (o-PP), or biaxially oriented polypropylene (BOPP), polymethyl methacrylate, PES, polyethylene naphthalate (PEN), SAN, polymers containing fluorine, EVOH, polyamide, PVC, PVDC, PMMI, PA, ABS, MABS, PMP, PES, PSI.

16. The method as claimed in claim 1, wherein a glass, glass-ceramic or ceramic workpiece is plasma-treated.

17. The method as claimed in claim 1, wherein the electromagnetic energy is injected into the cavity by means of electrodes.

18. The method as claimed in claim 1, wherein an axisymmetric flow of the process gas through the cavity of the workpiece is produced, and wherein electromagnetic energy is input in the axial direction.

19. The method as claimed in claim 1, wherein the glow discharge is ignited by one of the following parameters:
   i) a high voltage in the range of 0.1 kV-100 kV
   ii) an alternating current with a frequency of 0.2 kHz-100 MHz,
   iii) an rms alternating current in the range of 0.01 mA-2 A.

20. The method as claimed in claim 1, wherein the electromagnetic energy is delivered through a coaxial cable and process gas is delivered through the inner conductor of the coaxial cable.

21. The method as claimed in claim 1, wherein the electromagnetic energy is injected through a coaxial cable and the treatment zone is evacuated through the coaxial cable.

22. The method as claimed in claim 1, wherein a functional layer is deposited by means of plasma deposition on pharmaceutical packaging.

23. The method as claimed in claim 1, wherein a layer, which contains at least one of the substances $SiO_x$, $SiO_xC_y$, $SiO_xN_y$, $SiN_y$, $TiO_x$, $Al_xO_yN_z$, $Al_xN_z$, $Al_xO_y$, $C_xH_y$, $C_xF_y$, $TiN_x$, is deposited by the plasma treatment.

24. The method as claimed in claim 1, wherein a cavity of a workpiece to be treated is filled at least partially with a filler body and the temperature distribution on the workpiece is thereby rendered more uniform during and after the plasma treatment.

25. The method as claimed in claim 1, wherein the workpiece comprises a first cylindrical or quasi-cylindrical surface and a cylindrical or quasi-cylindrical appendage with a smaller diameter and a shorter length and a second cylindrical or quasi-cylindrical surface, the diameter and the height of the appendage being less than the maximum diameter and the height by at least 20%.

* * * * *